(12) United States Patent
Jung

(10) Patent No.: US 12,272,395 B2
(45) Date of Patent: Apr. 8, 2025

(54) MEMORY DEVICE

(71) Applicant: SAMSUNG ELECTRONICS CO., LTD., Suwon-si (KR)

(72) Inventor: Buil Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 178 days.

(21) Appl. No.: 18/149,505

(22) Filed: Jan. 3, 2023

(65) Prior Publication Data
US 2023/0260566 A1 Aug. 17, 2023

(30) Foreign Application Priority Data
Feb. 14, 2022 (KR) ........................ 10-2022-0019095

(51) Int. Cl.
| | | |
|---|---|---|
| G11C 7/00 | (2006.01) | |
| G11C 11/408 | (2006.01) | |
| H10B 12/00 | (2023.01) | |

(52) U.S. Cl.
CPC ...... *G11C 11/4085* (2013.01); *G11C 11/4087* (2013.01); *H10B 12/315* (2023.02); *H10B 12/34* (2023.02)

(58) Field of Classification Search
CPC ....... G11C 7/1051; G11C 7/1078; G11C 7/22; G11C 7/106; G11C 7/1057
USPC ...................................................... 365/189.05
See application file for complete search history.

(56) References Cited

U.S. PATENT DOCUMENTS

| | | |
|---|---|---|
| 4,449,205 A | 5/1984 | Hoffman |
| 7,329,916 B2 | 2/2008 | Schloesser et al. |
| 8,008,144 B2 | 8/2011 | Ananthan et al. |
| 8,358,530 B2 | 1/2013 | Kamata |
| 8,884,340 B2 | 11/2014 | Kim et al. |
| 9,704,988 B2 | 7/2017 | Oh |
| 10,103,152 B2 | 10/2018 | Kim et al. |
| 10,833,087 B2 | 11/2020 | Fishburn et al. |
| 10,998,320 B2 | 5/2021 | Jen et al. |
| 2017/0221547 A1* | 8/2017 | Ishizu ................... G06F 3/0673 |
| 2020/0395461 A1 | 12/2020 | Kim |

FOREIGN PATENT DOCUMENTS

TW            I741172           10/2021

OTHER PUBLICATIONS

1st OA dated Mar. 28, 2024 in corresponding TW Patent Application No. 112103304.

* cited by examiner

*Primary Examiner* — Son T Dinh
(74) *Attorney, Agent, or Firm* — F. Chau & Associates, LLC

(57) ABSTRACT

A memory device includes a memory cell array including a plurality of memory cells, a sub word line driver block including a plurality of sub word line drivers configured to output word line signals, which are respectively provided to the plurality of memory cells, and a row decoder configured to generate word line enable signals, which are respectively provided to the plurality of memory cells. Each of the memory cells includes a cell transistor including dual gates, and a capacitor connected to the cell transistor. A word line enable signal applied by the row decoder is connected to one of the dual gates.

19 Claims, 18 Drawing Sheets

MEMORY DEVICE

CROSS-REFERENCE TO RELATED APPLICATION

This application claims priority under 35 U.S.C. § 119 to Korean Patent Application No. 10-2022-0019095, filed on Feb. 14, 2022 in the Korean Intellectual Property Office, the disclosure of which is incorporated by reference herein in its entirety.

TECHNICAL FIELD

Embodiments of the inventive concept relate to a memory device.

DISCUSSION OF RELATED ART

The capacity and speed of semiconductor memory devices used in various electronic systems are rapidly increasing according to high performance demands of users. In particular, a representative example of volatile memory devices may be dynamic random access memory (DRAM). DRAM stores data in a form of a charge stored in a cell capacitor. Because the charge stored in the cell capacitor leaks over time, DRAM has finite data retention characteristics. According to the finite data retention characteristics, DRAM performs a refresh operation to maintain the data stored therein. DRAM may maintain data stored in the cell capacitor by using the refresh operation.

The refresh operation of DRAM may be classified into a dynamic refresh operation performed after a read operation or a write operation is performed, and a static refresh operation performed in a standby mode state.

SUMMARY

Embodiments of the inventive concept provide a memory device having increased refresh characteristics.

Embodiments of the inventive concept provide a memory device capable of reducing a gate induced drain leakage (GIDL) current.

According to an embodiment of the inventive concept, a memory device includes a memory cell array including a plurality of memory cells, a sub word line driver block including a plurality of sub word line drivers configured to output word line signals, which are respectively provided to the plurality of memory cells, and a row decoder configured to generate word line enable signals respectively provided to the plurality of memory cells. Each of the memory cells includes a cell transistor including dual gates, and a capacitor connected to the cell transistor. The word line enable signal provided by the row decoder is connected to one of the dual gates. According to an embodiment of the inventive concept, a memory device includes a memory cell array including a plurality of memory cells, a plurality of sub word line drivers configured to output word line signals, which are respectively provided to the plurality of memory cells, and a row decoder configured to generate word line enable signals, which are respectively provided to the plurality of memory cells. Each of the sub word line drivers includes a p-type metal-oxide semiconductor (PMOS) transistor, a first n-type metal-oxide semiconductor (NMOS) transistor, and a second NMOS transistor. A word line enable signal among the word line enable signals is provided to a drain of the PMOS transistor, an inverted sub word line driving signal is provided to a gate of the PMOS transistor, an inverted word line enable signal, which is obtained by inverting the word line enable signal, is provided to a gate of the second NMOS transistor, and a word line signal among the word line signals is output to a common connection contact point of a source of the PMOS transistor, a drain of the first NMOS transistor, and a drain of the second NMOS transistor.

According to an embodiment of the inventive concept, a memory device includes a plurality of memory cells, each including an upper gate and a lower gate, a first metal line connected to upper gates of some among the plurality of memory cells, and a second metal line arranged adjacent to the first metal line. An activation timing of the first metal line is different from an activation timing of the second metal line.

BRIEF DESCRIPTION OF THE DRAWINGS

Embodiments of the inventive concept will be more clearly understood from the following detailed description taken in conjunction with the accompanying drawings, in which.

DETAILED DESCRIPTION OF THE EMBODIMENTS

Figure 1:
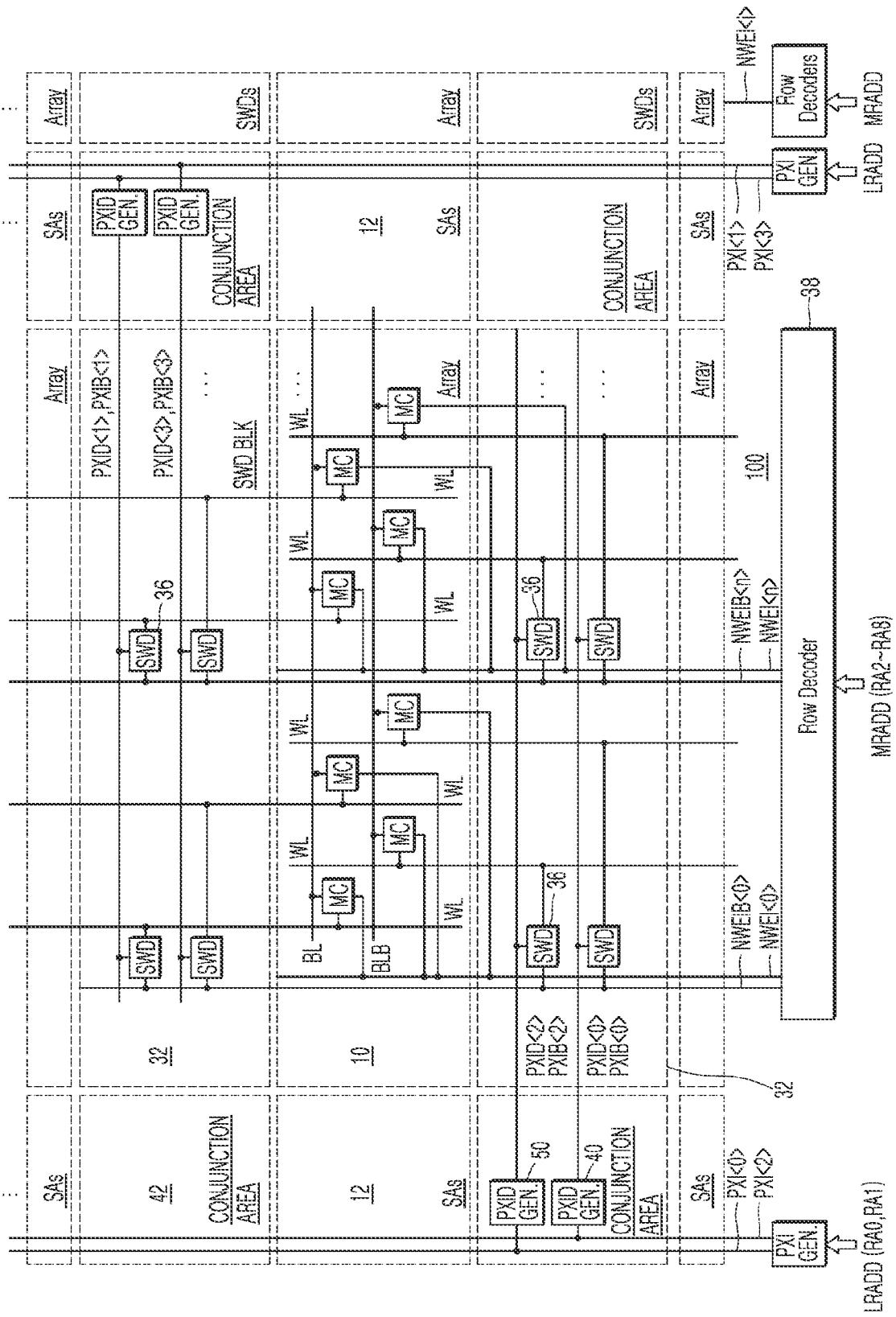
FIG. 1 is a block diagram of a memory device according to an embodiment.

Embodiments of the inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

The term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

FIG. 1 is a block diagram of a memory device 100 according to an embodiment.

The memory device 100 according to an embodiment illustrated in FIG. 1 may be a dynamic random access memory (DRAM) device. Referring to FIG. 1, the memory device 100 may include a plurality of sub cell arrays 10 constituting a memory cell array, bit line sense amplifier blocks (SAs) 12, sub word line driver blocks (SWD BLK) 32, a row decoder 38, and conjunction areas 42.

The conjunction areas 42 may include driving signal generation circuits 40 and 50 for supplying a high voltage that is higher than a power supply voltage, for example, a boost voltage (for example, VPP), to a word line WL.

Each of the sub cell arrays 10 may include a plurality of memory cells MC. Each memory cell MC may be disposed at an intersection of the word line WL and a bit line pair BL/BLB, which constitute a sub word line, and each memory cell MC may include one access transistor and one storage capacitor. The bit line pair BL/BLB may include bit lines BL and complementary bit lines BLB.

The memory cell MC of an embodiment of the inventive concept may include a cell transistor having a dual gate structure. Different signals may be applied to dual gates of the memory cell MC according to an embodiment of the inventive concept. According to an embodiment, a word line enable signal may be applied to an upper gate of the memory cell MC. A word line signal, which is an output of the sub word line driver, may be applied to a lower gate of the memory cell MC. Voltage levels of the word line enable signals NWEI<0> through NWEI<n> applied to the upper gate of the memory cell MC may be controlled by using the row decoder 38, and by controlling the voltage levels of the word line enable signals NWEI<0> through NWEI<n>, a gate induced drain leakage (GIDL) current in the memory cell MC may be reduced. This effect is described in further detail below.

A plurality of word lines WL may be driven by sub word line drivers 36 disposed in the sub word line driver block 32. Each of the sub word line drivers 36 may be controlled by each of inverted word line enable signals NWEBI<0> through NWEBI<n> output by the row decoder 38, sub word line driving signals PXID<0> through PXID<2> output by the driving signal generation circuits 40 and 50, and inverted sub word line driving signals PXIB<0> through PXIB<2>. Here, n may be a positive integer. The inverted word line enable signals NWEBI<0> through NWEBI<n> may be signals obtained by inverting the word line enable signals NWEI<0> through NWEI<n> output by the row decoder 38. In FIG. 1, although only the sub word line driving signals PXID<0> through PXID<2> and the inverted sub word line driving signals PXIB<0> through PXIB<2> are illustrated, sub word line driving signals and inverted sub word line driving signals may be provided in a greater number according to the number of sub word line drivers 36.

Hereinafter, the word line enable signal may be described as an NWEI signal, an inverted word line enable signal may be described as an NWEIB signal, a sub word line driving signal may be described as a PXID signal, and an inverted sub word line driving signal may be described as a PXIB signal. Each of the signals may be described to also mean all signal lines included in the corresponding signal. According to an embodiment, referring to FIG. 1, the PXID signal may include all of PXID<0>, PXID<1>, PXID<2>, and PXID<3>. The word line enable signal may include a write enable signal or a read enable signal.

The row decoder 38 may generate the word line enable signals NWEI<0> through NWEI<n> and the inverted word line enable signals NWEIB<0> through NWEIB<n>, in response to upper row addresses MRADD, for example, RA2 through RA8.

The upper row addresses MRADD may be buffered by a word line enable driver in the row decoder 38.

The row decoder 38 may provide each of the inverted word line enable signals NWEIB<0> through NWEIB<n> to the corresponding sub word line driver 36. For example, the row decoder 38 may receive and decode the upper row addresses MRADD, and activate one signal among the inverted word line enable signals NWEIB<0> through NWEIB<n>. Each of the activated inverted word line enable signals NWEIB<0> through NWEIB<n> may have a level of a boost voltage VPP. However, a voltage level of each of the activated inverted word line enable signals NWEIB<0> through NWEIB<n> is not limited thereto, and may be various levels according to embodiments.

The row decoder 38 may provide the word line enable signals NWEI<0> through NWEI<n> to the corresponding memory cell MC. The row decoder 38 may control the voltage levels of the word line enable signals NWEI<0> through NWEI<n>, and reduce the GIDL current. This process is described below in more detail with reference to FIGS. 4B through 5.

The driving signal generation circuit 40 may provide the sub word line driving signal PXID and the inverted sub word line driving signal PXIB to the corresponding sub word line driver 36.

A lower decoding signal generation circuit may receive and decode lower row addresses LRADD, for example, RA0 and RA1, and generate four lower decoding signals PXI<j> (j is 0 to 3).

The driving signal generation circuits 40 and 50 in the conjunction areas 42 may be driven by the lower decoding signals PXI<j>. The driving signal generation circuits 40 and 50 may generate PXID/PXIB signals, which are complementary signals for driving the sub word line drivers 36.

According to an embodiment, when the memory cell MC is accessed, the inverted word line enable signals and the PXID/PXIB signals corresponding to the memory cell MC may be activated. The corresponding sub word line driver 36 may drive the corresponding word line WL with the level of the boost voltage VPP.

After the access operation is totally completed, the sub word line driver 36 may precharge the sub word lines WL from a ground voltage VSS to a negative voltage VBB2.

A precharge voltage level of DRAM may be generally a level of a VBB2 voltage. The level of the VBB2 voltage may be higher than a back bias voltage VBB, and lower than a ground power voltage VSS. For example, in the case of a high integration DRAM, the level of the VBB2 voltage may be a level of about −0.35 V.

In this case, an access operation mode of DRAM may include a write operation mode and a read operation mode.

DRAM may perform an operation in page units when writing data to the memory cell or reading data from the memory cell. The operation in page units may refer to accessing the memory cell connected to the same word line, while changing a column address after enabling one word line. Accordingly, the operation of enabling the selected word line after receiving one row address may mean a simultaneous opening of all memory cells connected to one page. A unit of one page may include memory cells of 8 k bits or 16 k bits, and the number of memory cells may vary depending on a type of DRAM.

Because a plurality of memory cells corresponding to one page are connected to one word line, loading of the word lines may increase as the number of memory cells increases. The loading of the word line may mean a gate loading of the word line. Because it may be difficult for one word line driver to handle the word line loading, a plurality of sub word line drivers may be arranged. For example, each of the SWDs 36 may be distributed and arranged to share the word line loading according to an embodiment.

Figure 2:
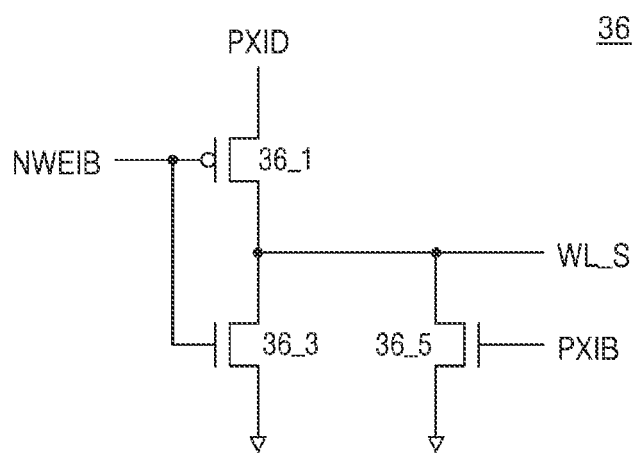
FIG. 2 is a circuit diagram of a sub word line driver according to an embodiment.

FIG. 2 is a circuit diagram of the sub word line driver 36 according to an embodiment.

Referring to FIG. 2, the sub word line driver 36 may receive an inverted word line enable signal NWEIB output by the row decoder 38, the sub word line driving signal PXID, and the inverted sub word line driving signal PXIB, and may activate the corresponding word line WL.

The sub word line driver 36 may include a p-type metal-oxide semiconductor (PMOS) transistor 36_1, a first n-type metal-oxide semiconductor (NMOS) transistor 36_3, and a second NMOS transistor 36_5. A gate terminal of the PMOS transistor 36_1 may be connected to the inverted word line enable signal NWEIB line, and a drain terminal thereof may be connected to the sub word line driving signal PXID line. A gate terminal of the first NMOS transistor 36_3 may be connected to an inverted word line enable signal NWEIB, a drain terminal thereof may be connected to a source terminal of the PMOS transistor 36_1, and the source terminal thereof may be connected to a ground voltage. A gate terminal of the second NMOS transistor 36_5 may be connected to the inverted sub word line driving signal PXIB, a drain terminal thereof may be connected to a source terminal of the PMOS transistor 36_1, and the source terminal thereof may be connected to a ground voltage. A word line signal WL_S applied to the word line WL may be output at a common connection contact point of the source terminal of the PMOS transistor 36_1, the drain terminal of the first NMOS transistor 36_3, and the drain terminal of the second NMOS transistor 36_5.

When the inverted word line enable signal NWEIB input to the sub word line driver 36 has a logic high level, for example, when the gate terminals of the PMOS transistor 36_1 and the first NMOS transistor 36_3 have an internal boost power voltage VPP level, the PMOS transistor 36_1 may be turned off and the first NMOS transistor 36_3 may be turned on. Accordingly, the word line WL may be connected to the ground voltage. In addition, the sub word line driver 36 may be in an inactivated state, the word line WL may maintain a logic low level, and a memory cell connected to the word line WL may not be selected.

When the inverted word line enable signal NWEIB input to the sub word line driver 36 has a logic low level, for example, when the gate terminals of the PMOS transistor 36_1 and the first NMOS transistor 36_3 have a ground voltage level or a negative voltage level VSS, the PMOS transistor 36_1 may be turned on and the first NMOS transistor 36_3 may be turned off. In this case, the sub word line driving signal PXID of the selected sub word line driver 36 may have a logic high level, and the inverted sub word line driving signal PXIB may have a logic low level. Accordingly, the second NMOS transistor 36_5 may also maintain a turn-off state. Accordingly, the sub word line driving signal PXID of a logic high level may be output to the word line WL. In addition, the sub word line driver 36 may be in an activated state, the word line WL may maintain a logic high level, a memory cell connected to the word line WL may be selected, and data of the memory cell may be output to the bit line BL.

In the case of FIG. 2, a pull-up driver of the sub word line driver 36 may include a PMOS transistor. However embodiments are not limited thereto. For example, according to an embodiment, the pull-up driver may also include an NMOS transistor according to a type of the sub word line driver. The second NMOS transistor 36_5 may hold the word line WL at the ground voltage level when an adjacent word line WL is enabled. When the second NMOS transistor 36_5 is removed, the first NMOS transistor 36_3 may partially maintain the ground voltage level.

Figure 3A:
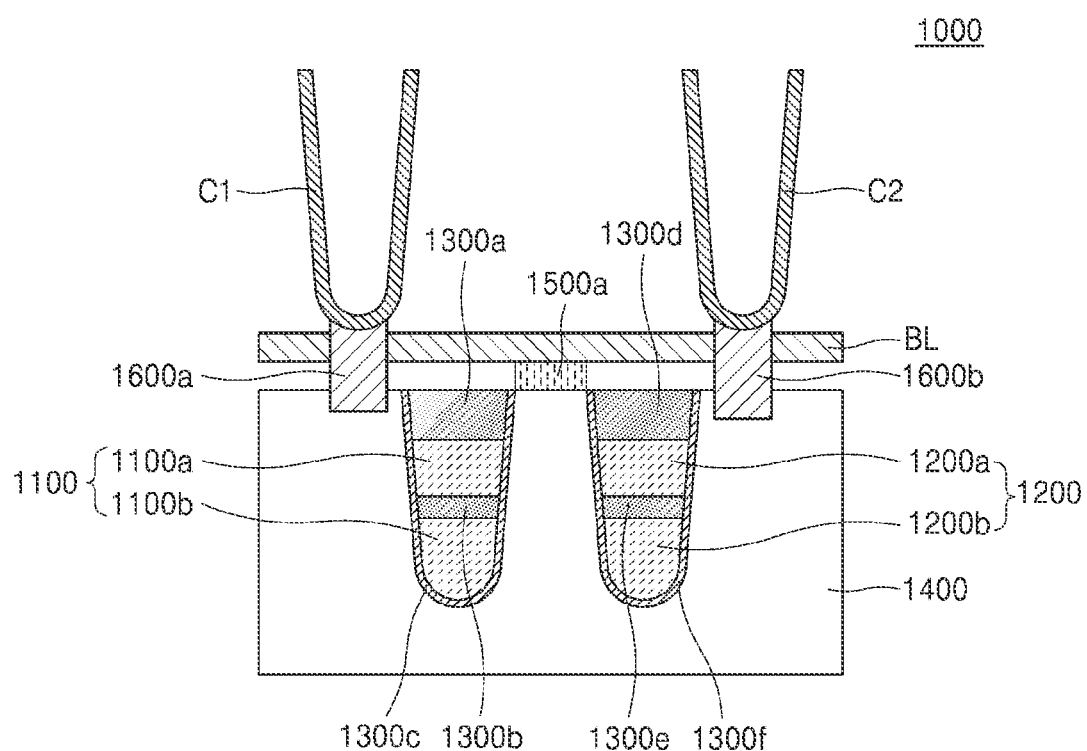
FIG. 3A is a cross-sectional view of a portion of a sub cell array, according to an embodiment.

FIG. 3A is a cross-sectional view of a portion of a sub cell array, according to an embodiment.

Referring to FIG. 3A, a sub cell array 1000 according to an embodiment may include an active area 1400 and gate areas 1100 and 1200 arranged on a recessed area of a substrate. Insulating materials 1300c and 1300f may be respectively arranged between the gate areas 1100 and 1200 and the active area 1400. The gate area 1100 arranged in the recessed area of the substrate may include a first gate 1100*a* and a second gate 1100*b*, and the gate area 1200 arranged in the recessed area of the substrate may include a first gate 1200*a* and a second gate 1200*b*. The first gates 1100*a* and 1200*a* and the second gates 1100*b* and 1200*b* may be physically separated from each other. Insulating materials 1300*b* and 1300*d* may be respectively arranged between the first gates 1100*a* and 1200*a* and the second gates 1100*b* and 1200*b*.

Referring to FIG. 3A, signals having different voltage levels from each other may be applied to the first gates 1100*a* and 1200*a* and the second gates 1100*b* and 1200*b*, which are separated from each other. A voltage applied to the first gates 1100*a* and 1200*a* may be applied by the row decoder 38. A voltage applied to the second gates 1100*b* and 1200*b* may be a voltage of a word line signal generated as an output of a sub word line driver. In the following disclosure, for convenience of description, the first gates 1100*a* and 1200*a* are described as upper gates and the second gates 1100*b* and 1200*b* are described as lower gates. Expressions of 'the first gate' and 'the second gate' and expressions of 'the upper gate' and 'the lower gate' may be interchangeably used when describing embodiments of the inventive concept. In addition, word lines applied to the upper gate and the lower gate may be the first word line and the second word line, respectively. Hereinafter, a signal supplied to the word line applied to the upper gate may be described as a first word line signal (top word line, TWL), and the word line signal applied to the lower gate may be described as a second word line signal (bottom word line, BWL).

Referring to FIG. 3A, a cross-sectional view of two memory cells each including the gate areas 1100 and 1200 is disclosed. A bit line BL may be connected to the active area 1400 between the gate area 1100 and the gate area 1200. Transistors included in two memory cells may share a bit line BL. Capacitors C1 and C2 may be connected to the active area 1400, to which the bit line BL is not connected. The sub cell array 1000 according to an embodiment of FIG. 3A may include a buried channel array transistor (BCAT). A space between the bit line BL and the active area 1400 and a space between the capacitors C1 and C2 and the active area 1400 may include contacts 1500*a*, 1600*a*, and 1600*b*.

Figure 3B:
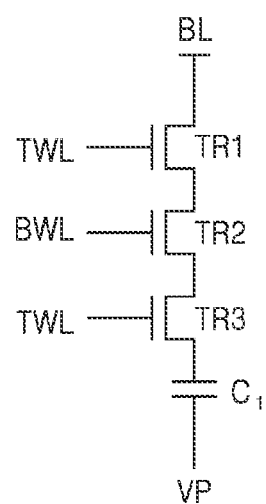
FIG. 3B illustrates an equivalent circuit diagram of a portion of a sub cell array according to an example of FIG. 3A.

FIG. 3B illustrates an equivalent circuit diagram of a memory cell included in a portion of the sub cell array according to an example of FIG. 3A.

Referring to FIG. 3B, the memory cell may include a first NMOS transistor TR1, a second NMOS transistor TR2, a third NMOS transistor TR3, and a capacitor C1. The first NMOS transistor TR1, the second NMOS transistor TR2, and the third NMOS transistor TR3 are connected in series. A bit line BL may be connected to a drain of the first NMOS transistor TR1, and the first word line signal TWL may be applied to a gate thereof. A drain of the second NMOS transistor TR2 may be connected to a source of the first NMOS transistor TR1. A second word line signal BWL may be applied to a gate of the second NMOS transistor TR2, and a drain of the third NMOS transistor TR3 may be connected to a source of the second NMOS transistor TR2. The first word line signal TWL may be applied to a gate of the third NMOS transistor TR3, and the capacitor C1 may be connected to a source of the third NMOS transistor TR3.

According to the equivalent circuit diagram of FIG. 3B, the first NMOS transistor TR1 and the third NMOS transistor TR3 may be formed in a channel area formed by the first gate 1100*a* in FIG. 3A, and a second NMOS transistor TR2 may be formed in a channel area formed by the second gate 1100*b* in FIG. 3A. The capacitor C1 in the equivalent circuit diagram of FIG. 3B may correspond to the capacitor C1 in FIG. 3A.

According to the equivalent circuit diagram of FIG. 3B, the first word line signal TWL may be applied to the gates of the first NMOS transistor TR1 and the third NMOS transistor TR3, and the second word line signal BWL may be applied to the gate of the second NMOS transistor TR2.

The equivalent circuit diagram of FIG. 3B is described further below with reference to the enlarged drawing of FIG. 3C.

Figure 3C:
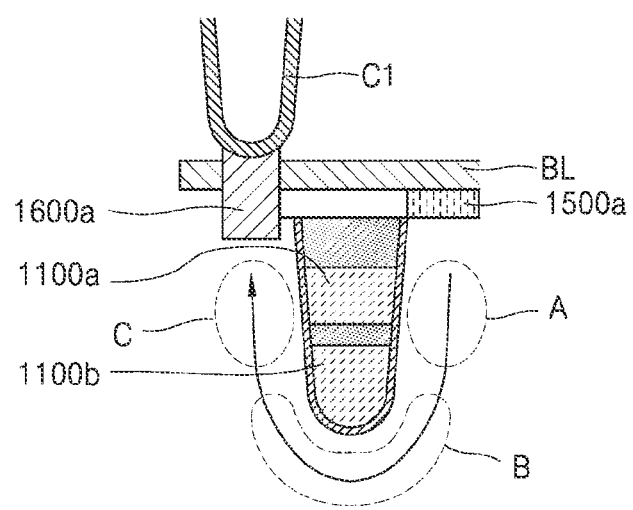
FIG. 3C is a diagram of a channel structure of a portion of a sub cell array, according to an example of FIG. 3A.

FIG. 3C is a diagram of a channel structure of a portion of a sub cell array, according to an example of FIG. 3A.

Referring to FIG. 3C, a portion of the memory cell of FIG. 3A is enlarged. According to an embodiment, a channel may be formed in the active area 1400. According to an embodiment, a channel may be formed from the bit line BL toward the capacitor C1. A flow direction of charges in the formed channel may be the same as the arrow illustrated in FIG. 3C.

Referring to FIGS. 3A through 3C, the gate area 1100 of a memory cell according to an embodiment of the inventive concept may be divided into the first gate 1100*a* and the second gate 1100*b*, and separate voltage levels may be respectively applied to each of the first and second gates 1100*a* and 1100*b*. Because a voltage is applied to the gate area 1100, a channel may be formed in the active area 1400. The channel may include an A area, a B area, and a C area.

Charges may move in the order of the A area, the B area, and the C area. The A area and the C area may be channel areas formed by a voltage applied to the first gate 1100*a*, and the B area may be a channel area formed by a voltage applied to the second gate 1100*b*. A flow of charges in the A area and the C area may correspond to a current flowing in the first NMOS transistor TR1 and the third NMOS transistor TR3 in FIG. 3B, and a flow of charges in the B area may correspond to a current flowing in the second NMOS transistor TR2. The A area may be described by a channel of the first NMOS transistor TR1, the B area may be described by a channel of the second NMOS transistor TR2, and the C area may be described by a channel of the third NMOS transistor TR3.

In the drawings referenced hereinafter, when a memory cell according to an embodiment of the inventive concept is represented as a circuit diagram, the circuit diagram of FIG. 3B is used to illustrate and describe the memory cell. However, the memory cell according to embodiments of the inventive concept is not limited to include three transistors.

Figure 4A:
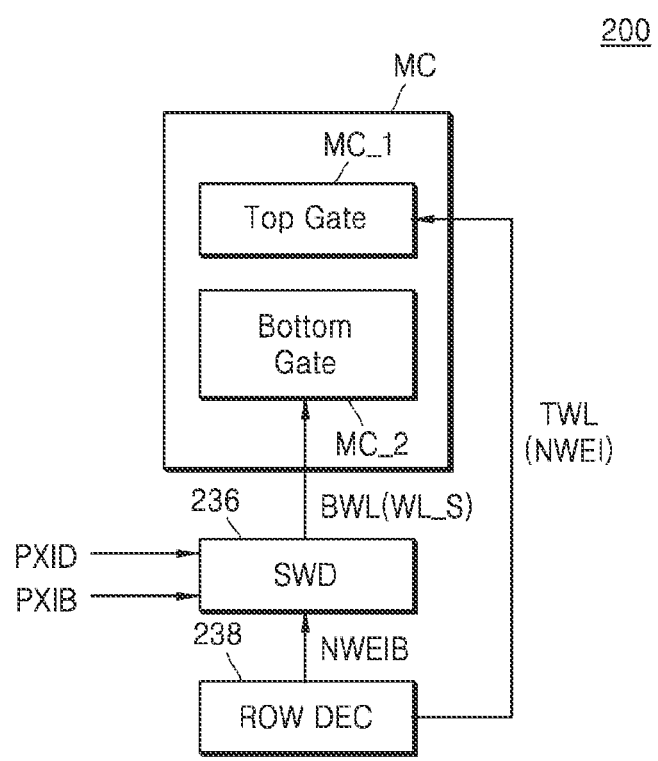
FIG. 4A is a block diagram of a signal connection relationship between a memory cell, a sub word line driver, and a row decoder, according to an embodiment.

FIG. 4A is a block diagram of a signal connection relationship between a sub cell array, a sub word line driver 236, and a row decoder 238, according to an embodiment.

Referring to FIG. 4A, the row decoder 238 may generate the word line enable signal NWEI and the inverted word line enable signal NWEIB. The inverted word line enable signal NWEIB may be applied to the sub word line driver 236. The word line enable signal NWEI may be applied to the memory cell MC. The sub word line driving signal PXID and the inverted sub word line driving signal PXIB, which control a sub word line driver 236, may be applied to the sub word line driver 236.

Referring to FIG. 4A, a block diagram of one memory cell MC included in a sub cell array is disclosed. The word line enable signal NWEI and the word line signal WL_S may be applied to the memory cell MC. As described above with reference to FIGS. 3A through 3C, the gate of the memory cell MC according to an embodiment of the inventive concept may be separated and provided into an upper gate MC_1 and a lower gate MC_2. According to an embodiment of the inventive concept, voltage signals having different levels from each other may be respectively applied to the upper gate MC_1 and the lower gate MC_2. Referring to FIG. 4A, the first word line signal TWL applied to the upper gate MC_1 may include the word line enable signal NWEI. The second word line signal BWL applied to the lower gate MC_2 may include the word line signal WL_S generated by the sub word line driver 236. According to an embodiment, in the standby mode of the memory device, a voltage level of the word line enable signal NWEI may be different from a voltage level of the word line signal WL_S generated by the sub word line driver 236.

Figure 4B:
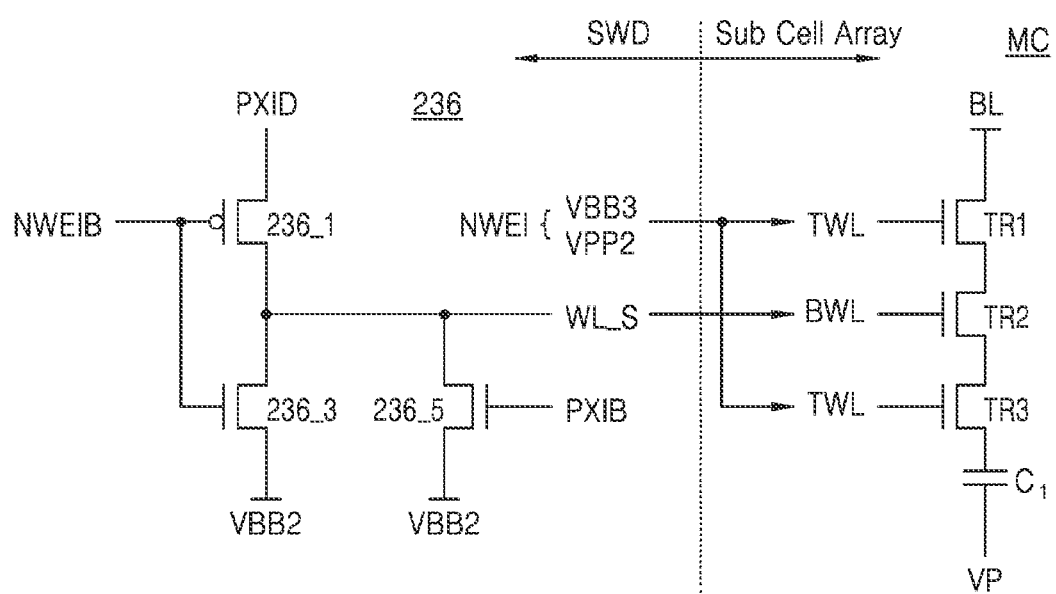
FIG. 4B is a circuit diagram of a signal connection relationship between a sub cell array and a sub word line driver, according to an embodiment.

FIG. 4B is a circuit diagram of a signal connection relationship between a sub cell array and the sub word line driver 236, according to an embodiment.

FIG. 4B is a circuit diagram of the block diagram of FIG. 4A. Referring to FIG. 4B, a circuit diagram of the sub word line driver 236 and a circuit diagram of the memory cell MC included in the sub cell array are disclosed. The sub word line driver 236 may include a PMOS transistor 236_1, a first NMOS transistor 236_3, and a second NMOS transistor 236_5. The description of the circuit structure of the sub word line driver 36 illustrated in FIG. 2 may be equally applied to the sub word line driver 236.

According to FIG. 4B, the first word line signal TWL applied to the upper gate of the memory cell MC may include the word line enable signal NWEI generated by the row decoder REC DEC. Referring to FIG. 4B, the second word line signal BWL applied to the lower gate of the memory cell MC may include the word line signal WL_S generated by the sub word line driver 236.

A voltage level of the word line enable signal NWEI applied to the upper gate of the memory cell MC may be different from a voltage level of the word line signal WL_S applied to the lower gate of the memory cell MC. In addition, a voltage level of the word line enable signal NWEI applied to the upper gate of the memory cell MC in the active mode may be different from that in the standby mode. According to an embodiment, the active mode may be a mode in which the memory device performs read or write operations. According to an embodiment, the standby mode may be a mode in which the memory device does not perform read or write operations. According to an embodiment, the standby mode may be an off mode of the memory device.

The conditions in which the row decoder adjusts the voltage level of the word line enable signal NWEI are described in detail with reference to Table 1 below.

TABLE 1

| mode | PXID | PXIB | NWEIB | NWEI | TWL | BWL | WL state |
|---|---|---|---|---|---|---|---|
| first active | VPP | VSS | VSS | VPP2 | VPP2 | VPP | selected |
| second active | VPP | VSS | VPP | VBB3 | VBB3 | VBB2 | unselected |
| third active | VSS | VPP | VSS | VPP2 | VPP2 | VBB2 | unselected |
| standby | VSS | VPP | VPP | VBB3 | VBB3 | VBB2 | unselected |

Each of the voltages shown in Table 1 is described below.

The VPP may be a boost voltage of the memory cell MC. The VSS may be a ground voltage of the memory cell MC. The VBB2 may be a precharge voltage level of the memory cell MC. According to an embodiment, the VBB2 may be a negative voltage. The VPP2 may be a boost voltage having a voltage level higher than that of the VPP. The VBB3 may be a negative voltage having a voltage level higher than that of the VBB2.

Table 1 shows examples of voltage levels of the sub word line driving signal PXID, the inverted sub word line driving signal PXIB, the inverted word line enable signal NWEIB, which are signals applied to the sub word line driver 236, and voltage levels of the word line enable signal NWEI, which are signals applied to the memory cell MC. In addition, a voltage level of the first word line signal TWL applied to the upper gate of the memory cell MC and a voltage level of the second word line signal BWL applied to the lower gate of the memory cell MC are disclosed by the signals, and accordingly, whether a word line of the corresponding memory cell MC is finally selected is disclosed.

The operation of the sub word line driver in FIG. 4B is described below.

The inverted word line enable signal NWEIB applied to a gate of a PMOS transistor 236_1 of the sub word line driver may be enabled when the inverted word line enable signal NWEIB is a ground voltage, that is, the ground voltage VSS. The sub word line driving signal PXID applied to a drain of the PMOS transistor 236_1 may be enabled when the sub word line driving signal PXID is the boost voltage VPP. In addition, the inverted sub word line driving signal PXIB applied to a gate of the second NMOS transistor 236_5 may be enabled when the inverted sub word line driving signal PXIB is the ground voltage VSS.

According to Table 1, when the voltage level of the inverted word line enable signal NWEIB applied to the gate of the PMOS transistor 236_1 is the ground voltage VSS, the voltage level of the sub word line driving signal PXID applied to the drain of the PMOS transistor 236_1 is the boost voltage VPP, and the inverted sub word line driving signal PXIB applied to the gate of the second NMOS transistor 236_5 is the ground voltage VSS, the voltage level of the word line signal WL_S may be determined to be the boost voltage VPP. The output of the word line signal WL_S generated by the sub word line driver 236 may be applied to the lower gate of the memory cell MC.

Because a memory cell according to an embodiment of the inventive concept includes an upper gate and a lower gate, and signals having different voltage levels from each other are respectively applied to separate gates, gates may finally have different voltage levels, compared to the case in which one word line signal is applied to one gate.

Referring to FIG. 4B, because an equivalent circuit of the separated upper gate and the separated lower gate of the memory cell MC included in the sub cell array may correspond to a series connection of three transistors, that is, TR1, TR2, and TR3, it may be determined that a corresponding word line is selected when all of the three transistors, that is, TR1, TR2, and TR3, are turned on.

According to an example of FIG. 4B, the voltage level of the word line enable signal NWEI applied to the upper gate may have the voltage level of the negative voltage VBB3 in the standby mode. The voltage level of the word line enable signal NWEI applied to the upper gate may have the voltage level of the boost voltage VPP2 in the active mode. According to an embodiment, the voltage level of the negative voltage VBB3 in the standby mode may be higher than a voltage level of the negative voltage level VBB2. According to an embodiment, the voltage level of the boost voltage VPP2 in the active mode may be higher than the voltage level of the boost voltage VPP. According to an embodiment, the negative voltage VBB2 may be a reference standby voltage of the memory cell. According to an embodiment, the boost voltage VPP may be a reference active voltage of the memory cell. According to an embodiment, the reference standby voltage of the memory cell may be a word line voltage in the standby mode when only one gate is provided. According to an embodiment, the reference active voltage of the memory cell may be a word line voltage in the active mode when only one gate is provided.

Referring to Table 1, in a first active mode, the word line enable signal NWEI having the voltage level of the boost voltage VPP2 may be applied to the upper gate, and the word line signal WL_S having the voltage level of the boost voltage VPP may be applied to the lower gate. According to the first active mode, because the voltage level of the gate connected to the first through third transistors TR1, TR2, and TR3 included in the equivalent circuit is a positive voltage, the corresponding word line may be selected.

In the first active mode, a voltage level of a gate area of the memory cell MC according to an embodiment of the inventive concept may be higher than the voltage level of the boost voltage VPP of a gate in a conventional memory cell. In the active mode, when the voltage of the word line increases, the on-resistance of a transistor decreases. According to the first active mode, because a voltage level of the gate may be higher than a voltage level of the existing memory cell, an on-resistance of the transistor is reduced, and a last data-in to PRE command period (tRDL) related to recovery of cell data after the write mode may be improved.

In a second active mode, the word line enable signal NWEI may have the voltage level of the negative voltage VBB3. The word line signal WL_S, which is output according to the sub word line driving signal PXID, the inverted sub word line driving signal PXIB, and the inverted word line enable signal NWEIB, may have the voltage level of the negative voltage VBB2. Accordingly, in the second active mode, because the gate voltage of the transistors included in the equivalent circuit is a negative voltage, the corresponding word line may not be selected.

In a third active mode, the word line enable signal NWEI has the voltage level of the boost voltage VPP2. The word line signal WL_S, which is output according to the sub word line driving signal PXID, the inverted sub word line driving signal PXIB, and the inverted word line enable signal NWEIB, may have the voltage level of the negative voltage VBB2. Accordingly, in the third active mode, because the gate voltages of some of the transistors included in the equivalent circuit are a negative voltage, the corresponding word line may not be selected.

In the standby mode, the word line enable signal NWEI may have the voltage level of the negative voltage VBB3. The word line signal WL_S, which is output according to the sub word line driving signal PXID, the inverted sub word line driving signal PXIB, and the inverted word line enable signal NWEIB, may have the voltage level of the negative voltage VBB2. Because the negative voltage VBB3 that is higher than the negative voltage VBB2 in the existing word line standby mode is applied to the upper gate, the field may be relaxed and accordingly, the GiDL current may be reduced.

According to an embodiment of the inventive concept, the lower gate, to which the word line signal WL_S is applied, may apply the same signal as before, but the voltage level of the word line enable signal NWEI applied to the upper gate may be controlled differently in the active mode and the standby mode, and then, the GIDL current in the standby mode may be reduced. According to an embodiment of the inventive concept, by applying, to the upper gate, the word line enable signal NWEI having a voltage level higher than the voltage level of the word line signal WL_S applied to the lower gate in the standby mode, static refresh characteristics may be improved, and by applying, to the upper gate, the word line enable signal NWEI having a voltage level equal to or higher than the voltage level of the word line signal WL_S applied to the lower gate in the active mode, dynamic refresh characteristics may be maintained or tRDL characteristics may be improved.

According to an embodiment of the inventive concept, the structure of the sub word line driver may be unchanged, but the word line enable signal NWEI, which is high active, may be connected to the upper gate of the memory cell. By separating the voltage level of the word line enable signal NWEI in the standby mode and the voltage level of the word line enable signal NWEI in the active mode from the voltage level of the word line signal WL_S applied to the lower gate, different voltage levels from each other may be used. According to an embodiment, because an effect may be obtained by adjusting the voltage level of the word line enable signal NWEI without using the sub word line driver, an effect may be obtained without a large increase in layout overhead.

According to an embodiment, the control of the voltage level of the word line enable signal NWEI may be performed in the row decoder ROW DEC. The row decoder may control the voltage level of the word line enable signal NWEI so that, in each of the standby mode and the active mode, the voltage level of the word line enable signal NWEI has a value greater than the voltage level of the word line signal WL_S.

Figure 5:
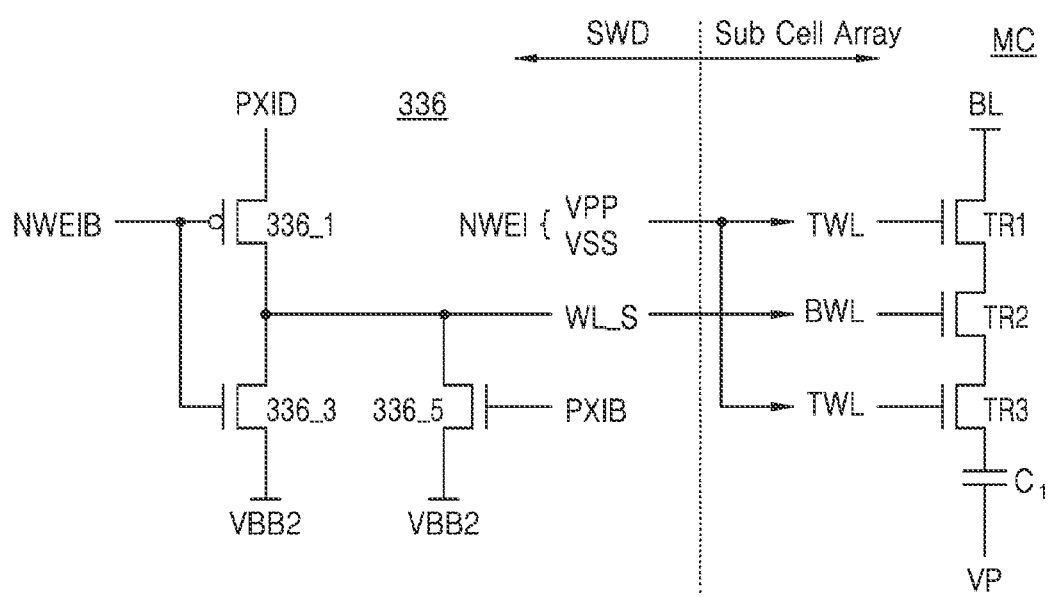
FIG. 5 is a circuit diagram of a signal connection relationship between a sub cell array and a sub word line driver, according to an embodiment.

FIG. 5 is a circuit diagram of a connection structure between a sub cell array and the sub word line driver, according to an embodiment.

In the following description of the circuit diagram of a connection structure between the memory cell MC and the sub word line driver according to FIG. 5, for convenience of explanation, a further description of components and technical aspects previously described with reference to FIG. 4B is omitted.

Referring to FIG. 5, the connection structure in FIG. 4B is the same as that of the sub word line driver 336. According to an embodiment of FIG. 5, the voltage level of the word line enable signal NWEI may be different from that in FIG. 4B.

This is described with reference to Table 2 below.

TABLE 2

| mode | PXID | PXIB | NWEIB | NWEI | TWL | BWL | WL state |
|---|---|---|---|---|---|---|---|
| first active | VPP | VSS | VSS | VPP | VPP | VPP | selected |
| second active | VPP | VSS | VPP | VSS | VSS | VBB2 | unselected |
| third active | VSS | VPP | VSS | VPP | VPP | VBB2 | unselected |
| standby | VSS | VPP | VPP | VSS | VSS | VBB2 | unselected |

In Table 2, for convenience of explanation, a further description of the same parts as those previously described with reference to Table 1 is omitted.

Referring to Table 2, a fact that the voltage level of the word line enable signal NWEI is the ground voltage VSS or the boost voltage VPP may be different from the embodiment of Table 1.

According to an example of FIG. 5, the voltage level of the word line enable signal NWEI applied to the upper gate may have the voltage level of the ground voltage VSS in the standby mode. The voltage level of the word line enable signal NWEI applied to the upper gate may have the voltage level of the boost voltage VPP in the active mode. According to an embodiment, the voltage level of the word line enable signal NWEI may be the same as that of an inverted voltage level of the inverted word line enable signal NWEIB.

Referring to Table 2, in a first active mode, the word line enable signal NWEI having the voltage level of the boost voltage VPP may be applied to the upper gate, and the word line signal WL_S having the voltage level of the boost voltage VPP may be applied to the lower gate. According to the first active mode, because the voltage level of the gate connected to the transistors included in the equivalent circuit is a positive voltage, the corresponding word line may be selected.

In a second active mode, the word line enable signal NWEI may have the voltage level of the ground voltage VSS. The word line signal WL_S, which is output according to the sub word line driving signal PXID, the inverted sub word line driving signal PXIB, and the inverted word line enable signal NWEIB, may have the voltage level of the negative voltage VBB2. Accordingly, in the second active mode, because the gate voltage of the transistors included in the equivalent circuit is a negative voltage, the corresponding word line may not be selected.

In a third active mode, the word line enable signal NWEI has the voltage level of the boost voltage VPP. The word line signal WL_S, which is output according to the sub word line driving signal PXID, the inverted sub word line driving signal PXIB, and the inverted word line enable signal NWEIB, may have the voltage level of the negative voltage VBB2. Accordingly, in the third active mode, because the gate voltages of some of the transistors included in the equivalent circuit are a negative voltage, the corresponding word line may not be selected.

In the standby mode, the word line enable signal NWEI may have the voltage level of the ground voltage VSS. The word line signal WL_S, which is output according to the sub word line driving signal PXID, the inverted sub word line driving signal PXIB, and the inverted word line enable signal NWEIB, may have the voltage level of the negative voltage VBB2. Because the ground voltage VSS, which is higher than the negative voltage VBB2 in the existing word line standby mode, is applied to the upper gate, the field may be relaxed and accordingly, the GIDL current may be reduced.

According to an embodiment of FIG. 5, the GIDL may be reduced by using the word line enable signal NWEI obtained by inverting the existing inverted word line enable signal NWEIB. According to an embodiment of FIG. 5, even though a new voltage is not generated by using the row decoder ROW DEC, the same effect may be obtained by inverting the existing inverted word line enable signal NWEIB, and thus, implementation complexity may be reduced.

According to an embodiment of FIG. 5, the row decoder may control the voltage level of the word line enable signal NWEI so that the voltage level of the word line enable signal NWEI is equal to or greater than the voltage level of the word line signal WL_S. According to an embodiment, in the standby mode, the row decoder may control the voltage level of the word line enable signal NWEI to be greater than the reference standby voltage of the word line signal WL_S, and in the active mode, the row decoder may control the voltage level of the word line enable signal NWEI to be equal to the reference standby voltage of the word line signal WL_S.

Figure 6A:
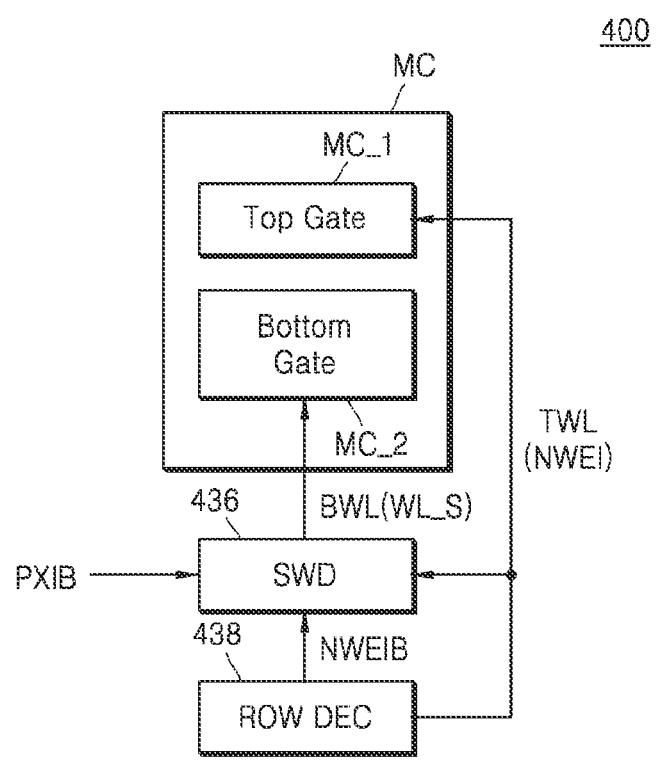
FIG. 6A is a block diagram of a signal connection relationship between a sub cell array, a sub word line driver, and a row decoder, according to an embodiment.

FIG. 6A is a diagram of a signal connection relationship between the memory cell MC, a sub word line driver 436, and a row decoder 438, according to an embodiment.

Referring to FIG. 6A, the row decoder 438 may generate the word line enable signal NWEI and the inverted word line enable signal NWEIB. The inverted word line enable signal NWEIB may be applied to the sub word line driver 436. The word line enable signal NWEI may be applied to the memory cell MC and the sub word line driver 436. The inverted sub word line driving signal PXIB for controlling the sub word line driver 436 may be applied to the sub word line driver 436.

Referring to FIG. 6A, the word line enable signal NWEI and the word line signal WL_S may be applied to the memory cell MC. As described above with reference to FIGS. 3A through 3C, the memory cell MC according to an embodiment of the inventive concept may include the upper gate MC_1 and the lower gate MC_2, which are separated. According to an embodiment of the inventive concept, two gates, for example, MC_1 and MC_2, may be provided to the memory cell MC, and thus, a separate signal may be applied to each gate. Referring to FIG. 6A, the word line enable signal NWEI may be applied to the upper gate MC_1, and the word line signal WL_S generated by the sub word line driver 436 may be applied to the lower gate MC_2.

Unlike an embodiment of FIG. 4A, in an embodiment of FIG. 6A, only the inverted sub word line driving signal PXIB may be used as a signal for driving the sub word line, and the word line enable signal NWEI may also be applied to the sub word line driver 436.

Figure 6B:
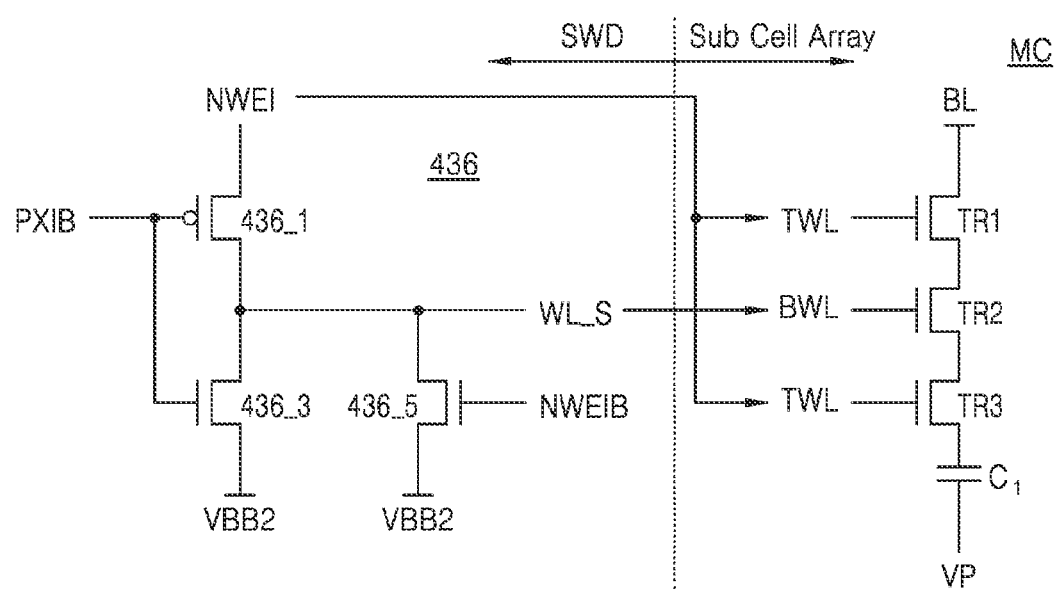
FIG. 6B is a circuit diagram of a signal connection relationship between a sub cell array and a sub word line driver, according to an embodiment.

FIG. 6B is a circuit diagram of a connection structure between the sub cell array and the sub word line driver, according to an embodiment.

FIG. 6B is a circuit diagram of the block diagram of FIG. 6A. Referring to FIG. 6B, a circuit diagram of the sub word line driver 436 and a circuit diagram of the memory cell MC according to embodiments of the inventive concept are disclosed. The sub word line driver 436 may include a PMOS transistor 436_1, a first NMOS transistor 436_3, and a second NMOS transistor 436_5.

The description of the circuit structure of the sub word line driver 36 illustrated in FIG. 2 may be equally applied to the sub word line driver 436 according to FIG. 6B. However, the input signal applied to the sub word line driver 36 illustrated in FIG. 2 may be different from the input signal applied to the sub word line driver 436 illustrated in FIG. 6B.

Referring to FIG. 6B, the inverted sub word line driving signal PXIB may be applied to gates of the PMOS transistor 436_1 and the first NMOS transistor 436_3. The word line enable signal NWEI may be applied to a drain of the PMOS transistor 436_1. The inverted word line enable signal NWEIB may be applied to a gate of the second NMOS transistor 436_5.

Unlike the sub word line driver 236 illustrated FIG. 4A, the sub word line driver 436 illustrated in FIG. 6B swaps and phase inverts the signal input to the gate of the PMOS transistor 436_1 and the signal input to the drain of the PMOS transistor 436_1, and applies the inverted word line enable signal NWEIB as an input to the gate of the second NMOS transistor 436_5.

According to an embodiment of FIG. 6B, the first word line signal TWL applied to the upper gate of the memory cell MC may be the word line enable signal NWEI generated by the row decoder ROW DEC. According to an embodiment of FIG. 6B, the second word line signal BWL applied to the lower gate of the memory cell MC may be the word line signal WL_S generated by the sub word line driver 436.

The conditions in which the row decoder adjusts the voltage level of the word line enable signal NWEI are described in detail with reference to Table 3 below.

TABLE 3

| mode | NWEI | NWEIB | PXIB | TWL | BWL | WL state |
|---|---|---|---|---|---|---|
| first active | VPP | VSS | VSS | VPP | VPP | selected |
| second active | VPP | VSS | VPP | VPP | VBB2 | unselected |
| third active | VBB3 | VPP | VSS | VBB3 | VBB2 | unselected |
| standby | VBB3 | VPP | VPP | VBB3 | VBB2 | unselected |

Table 3 shows examples of voltage levels of the inverted sub word line driving signal PXIB, the inverted word line enable signal NWEIB, and the word line enable signal NWEI, which are signals applied to the sub word line driver 436. In addition, a voltage level of the first word line signal TWL applied to the upper gate of the memory cell MC and a voltage level of the second word line signal BWL applied to the lower gate of the memory cell MC are disclosed by the signals, and accordingly, whether a word line of the corresponding memory cell MC is finally selected is disclosed.

The inverted sub word line driving signal PXIB applied to the gate of the PMOS transistor 436_1 of the sub word line driver 436 may be enabled when a ground voltage, for example, the ground voltage VSS, is applied. The word line enable signal NWEI applied to the drain of the PMOS transistor 436_1 may be enabled when the boost voltage VPP is applied. In addition, the inverted word line enable signal NWEIB applied to the gate of the second NMOS transistor 436_5 may be enabled when the ground voltage VSS is applied.

According to Table 3, when the voltage level of the inverted sub word line driving signal PXIB applied to the gate of the PMOS transistor 436_1 is the ground voltage VSS, the voltage level of the word line enable signal NWEI applied to the drain of the PMOS transistor 436_1 is the boost voltage VPP, and the voltage level of the inverted word line enable signal NWEIB applied to the gate of the second NMOS transistor 436_5 is the ground voltage VSS, the voltage level of the word line signal WL_S may be determined to be the boost voltage VPP. The output of the word line signal WL_S generated by the sub word line driver 436 may be applied to the lower gate of the memory cell MC.

According to an embodiment of FIG. 6B, the voltage level of the word line enable signal NWEI applied to the upper gate may have the voltage level of the negative voltage VBB3 in the standby mode. The voltage level of the word line enable signal NWEI applied to the upper gate may have the voltage level of the boost voltage VPP in the active mode. According to an embodiment, the voltage level of the negative voltage VBB3 may be higher than a voltage level of the negative voltage level VBB2.

Referring to Table 3, in a first active mode, the word line enable signal NWEI having the voltage level of the boost voltage VPP may be applied to the upper gate, and the word line signal WL_S having the voltage level of the boost voltage VPP may be applied to the lower gate. In the first active mode, because the voltage level of the gate connected to the transistors included in the equivalent circuit is a positive voltage, the corresponding word line may be selected.

In the second active mode, the word line enable signal NWEI has the voltage level of the boost voltage VPP. The word line signal WL_S output according to the inverted sub word line driving signal PXIB, the word line enable signal NWEI, and the inverted word line enable signal NWEIB may have the voltage level of the negative voltage VBB2. Accordingly, in the second active mode, because the gate voltages of some of the transistors included in the equivalent circuit are a negative voltage, the corresponding word line may not be selected.

In the third active mode, the word line enable signal NWEI may have the voltage level of the negative voltage VBB3. The word line signal WL_S output according to the inverted sub word line driving signal PXIB, the word line enable signal NWEI, and the inverted word line enable signal NWEIB may have the voltage level of the negative voltage VBB2. Accordingly, in the third active mode, because the gate voltages of all of the transistors included in the equivalent circuit are a negative voltage, the corresponding word line may not be selected.

In the standby mode, the word line enable signal NWEI may have the voltage level of the negative voltage VBB3. The word line signal WL_S output according to the inverted sub word line driving signal PXIB, the word line enable signal NWEI, and the inverted word line enable signal NWEIB may have the voltage level of the negative voltage VBB2. Because the negative voltage VBB3 higher than the negative voltage VBB2 in the existing word line standby mode is applied to the upper gate, the field may be relaxed and accordingly, the GiDL current may be reduced.

According to an embodiment of FIG. 6B, the row decoder may control the voltage level of the word line enable signal NWEI so that the voltage level of the word line enable signal NWEI is equal to or greater than the voltage level of the word line signal WL_S. According to an embodiment, in the standby mode, the row decoder may control the voltage level of the word line enable signal NWEI to be greater than the reference standby voltage of the word line signal WL_S, and in the active mode, the row decoder may control the voltage level of the word line enable signal NWEI to be equal to the reference standby voltage.

Figure 7:
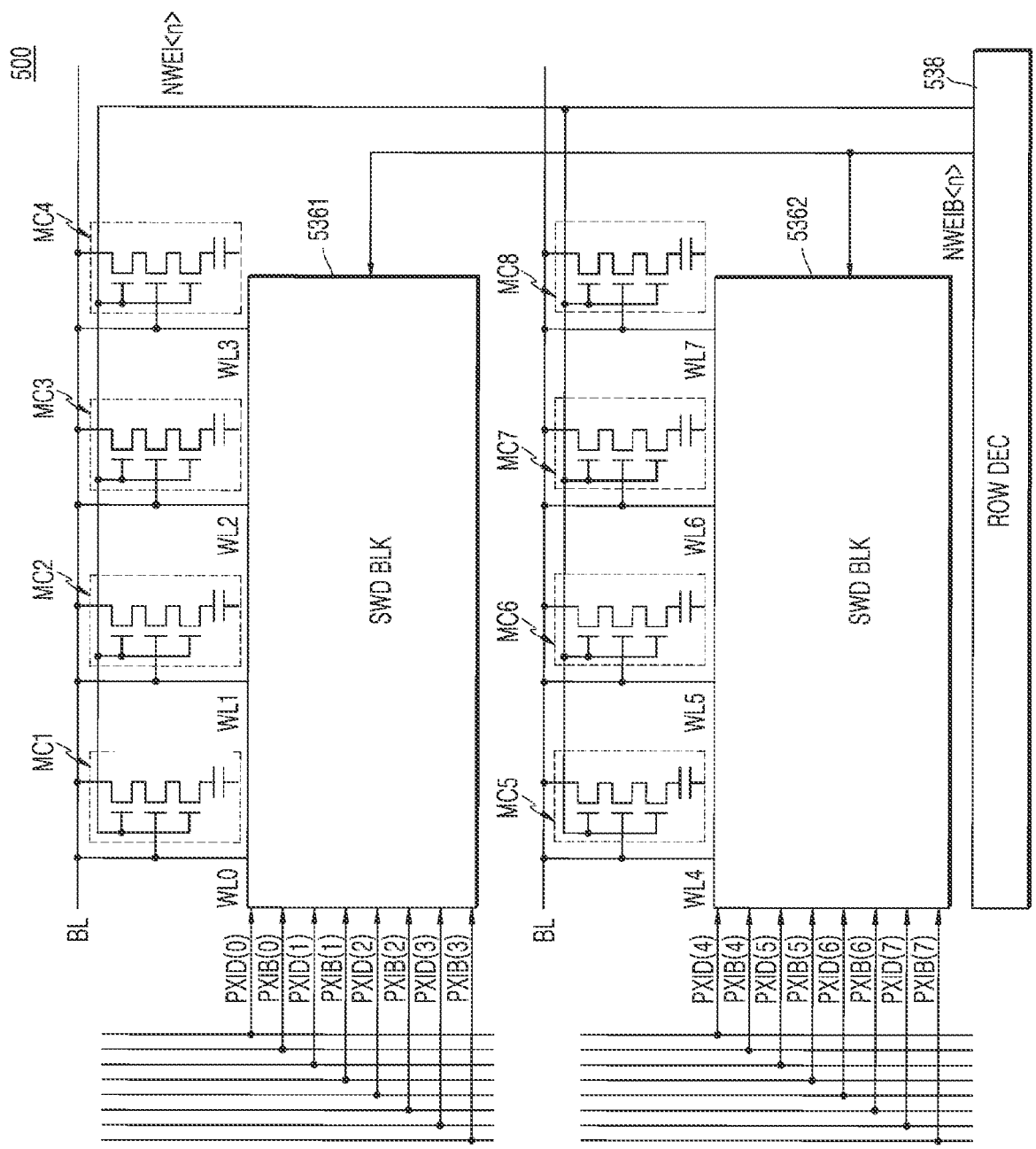
FIG. 7 is a block diagram of a memory device according to an embodiment.

FIG. 7 is a block diagram of a memory device 500 according to an embodiment.

The memory device 500 illustrated in FIG. 7 may include a row decoder 538, a first sub word line driver block 5361, a second sub word line driver block 5362, and eight memory cells MC1 through MC8.

The row decoder 538 may output an inverted word line enable signal NWEIB<n> and a word line enable signal NWEI<n>. Here, n may be a positive integer. The inverted word line enable signal NWEIB<n> may be applied to the first sub word line driver block 5361 and the second sub word line driver block 5362. Each of the first sub word line driver block 5361 and the second sub word line driver block 5362 may include a plurality of sub word line drivers (for example, the sub word line drivers illustrated in the figures). The number of sub word line drivers included in the first and second sub word line driver blocks 5361 and 5362 may correspond to the number of word lines to be controlled by the corresponding sub word line driver blocks 5361 and 5362. Referring to FIG. 7, because each of the first sub word line driver block 5361 and the second sub word line driver block 5362 is capable of controlling four word lines, each of the first sub word line driver block 5361 and the second sub word line driver block 5362 may include four sub word line drivers. Each sub word line driver may have the same structure as the circuit of the sub word line driver illustrated in FIG. 2.

Corresponding driving signals PXID<0 through 7> and PXIB<0 through 7> may be applied to each of the sub word line driver blocks 5361 and 5362, respectively. According to an embodiment, the sub word line driving signal PXID and the inverted sub word line driving signal PXIB may be applied to the sub word line driver blocks 5361 and 5362. According to an embodiment, the sub word line driver blocks 5361 and 5362 may include a plurality of sub word line drivers for individually controlling each word line. The sub word line driving signal PXID and the inverted sub word line driving signal PXIB may be applied as inputs of the sub word line driver, and thus, each of them may be provided in a number corresponding to the number of the sub word line drivers.

According to an embodiment, the first sub word line driver block 5361 may include four SWDs, and each sub word line driver may output the word line signals.

Referring to FIG. 7, the first sub word line driver block 5361 may output word line signals WL0 through WL3 applied to each of the memory cells MC1, MC2, MC3, and MC4. The sub word line driver outputting the word line signal WL0 may receive the inverted word line enable signal NWEIB, the sub word line driving signal PXID(0), and the inverted sub word line driving signal PXIB(0). The sub word line driver outputting the word line signal WL1 may receive the inverted word line enable signal NWEIB, the sub word line driving signal PXID(1), and the inverted sub word line driving signal PXIB(1). The sub word line drivers outputting remaining word line signals WL2 through WL7 may also receive the inverted word line enable signal NWEIB, sub word line driving signals PXID<2> through PXID<7>, and inverted sub word line driving signals PXIB<2> through PXIB<7>.

To output one word line signal, the sub word line driver may receive the inverted word line enable signal NWEIB, the sub word line driving signal PXID corresponding to a word line signal to be output, and the inverted sub word line driving signal PXIB.

The connection relationships between the inverted word line enable signal NWEIB<n> input to the sub word line driver and the sub word line driving signal PXID, and the inverted sub word line driving signal PXIB and components of the sub word line driver, has been described above, and for convenience of explanation, a repeated description thereof is omitted.

The word line signals WL0 through WL7 output from each sub word line driver may be input to the lower gates of the memory cells MC1 through MC8, and the word line enable signal NWEI<n> may be input to the upper gates of the memory cells MC1 through MC8.

Referring to FIG. 7, eight word lines and the memory cells MC1 through MC8 connected thereto may be controlled by using one word line enable signal NWEI<n> and one inverted word line enable signal NWEIB<n>.

Referring to FIG. 7, eight driving signals may be utilized to control eight word lines per one word line enable signal NWEI<n>. Referring to FIG. 7, to control eight word lines, one word line enable signal NWEI<n> may utilize eight sub word line driving signals PXID<0> through PXID<7> and eight inverted sub word line driving signals PXIB<0> through PXIB<7>.

Figure 8A:
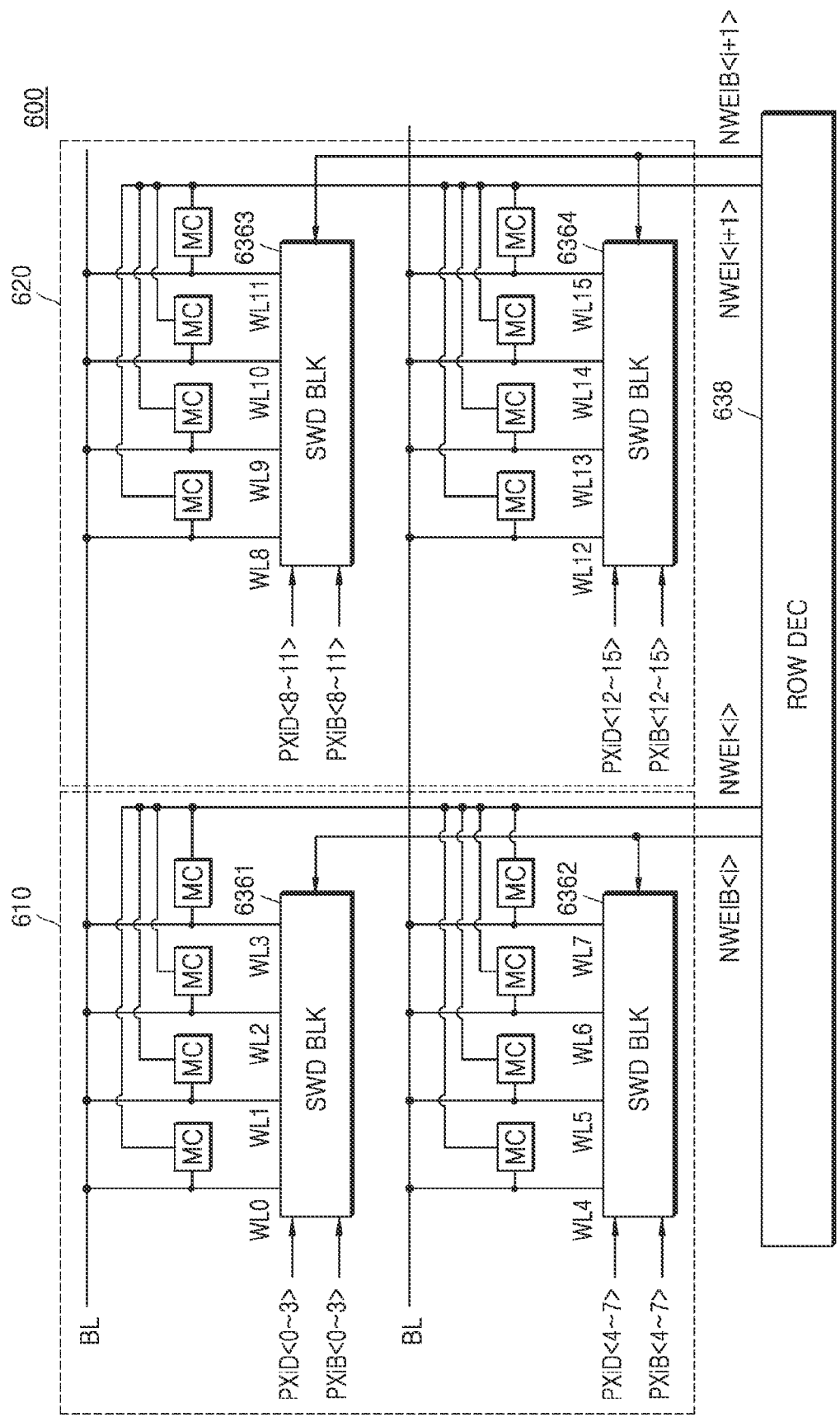
FIG. 8A is a block diagram of a memory device according to an embodiment.

FIG. 8A is a block diagram of a memory device 600 according to an embodiment.

According to an embodiment, the block diagram of the memory device 600 according to FIG. 8A may be a diagram to which a connection relationship between the sub word line driver and a sub cell array according to embodiments of FIGS. 4A and 4B is applied. For convenience of explanation, a further description of components and technical aspects previously described with reference to FIG. 7 is omitted.

Referring to FIG. 8A, four sub word line driver blocks 6361, 6362, 6363, and 6364 are disclosed. The sub word line driver blocks 6361, 6362, 6363, and 6364 may control four different word lines from each other, respectively.

Referring to FIG. 8A, a memory cell is illustrated as MC. The memory cells MC illustrated in FIG. 8 may have the same structure as the memory cells MC1 through MC8 illustrated in FIG. 7.

Referring to FIG. 8A, each memory cell MC may receive two input signals. According to an embodiment, an upper gate of dual gates of each memory cell may receive a word line enable signal, and a lower gate of the dual gates of the memory cell may receive a word line signal output by the sub word line driver block.

According to an embodiment of FIG. 8A, the memory device 600 capable of controlling eight driving signals per one word line enable signal NWEI is illustrated. This is an example of outputting eight word line signals per one word line enable signal line NWEI<i>. For example, the first sub word line driver block 6361 may output first through fourth word line signals WL0 through WL3. The second sub word line driver block 6362 may output fifth through eighth word line signals WL4 through WL7. The third sub word line driver block 6363 may output ninth through twelfth word line signals WL8 through WL11. The fourth sub word line driver block 6364 may output thirteenth through sixteenth word line signals WL12 through WL15. The sub word line driving signal PXID and the inverted sub word line driving signal PXIB for driving a corresponding word line may be applied to the sub word line driver blocks 6361, 6362, 6363, and 6364 illustrated in FIG. 8A. For example, first through fourth PXID signals PXID<0 to 3> and first through fourth PXIB signals PXIB<0 to 3> may be applied to the first sub word line driver block 6361. For example, eight driving signal lines may be connected to one sub word line driver block. Eight driving signal lines may be connected to the second sub word line driver block 6362 through the fourth sub word line driver block 6364 in the same manner.

Referring again to FIG. 8A, for convenience of description, an area including eight memory cells MC receiving the first word line enable signal NWEI<i> as an input is assumed as a first area 610, and an area including eight memory cells MC receiving the second word line enable signal NWEI<i+1> as an input is assumed as a second area 620. According to an embodiment, in the first area 610, a line, to which the first word line enable signal NWEI<i> is applied, and a line, to which the first inverted word line enable signal NWEIB<i> is applied, may be included, and in the second area 620, a line, to which the second word line enable signal NWEI<i+1> is applied, and a line, to which the second inverted word line enable signal NWEIB<i+1> is applied, may be included. Here, i may be a positive integer.

An arrangement structure of a metal line, to which a word line enable signal is applied, and a metal line, to which an inverted word line enable signal is applied, are described in more detail with reference to FIG. 8B.

Figure 8B:
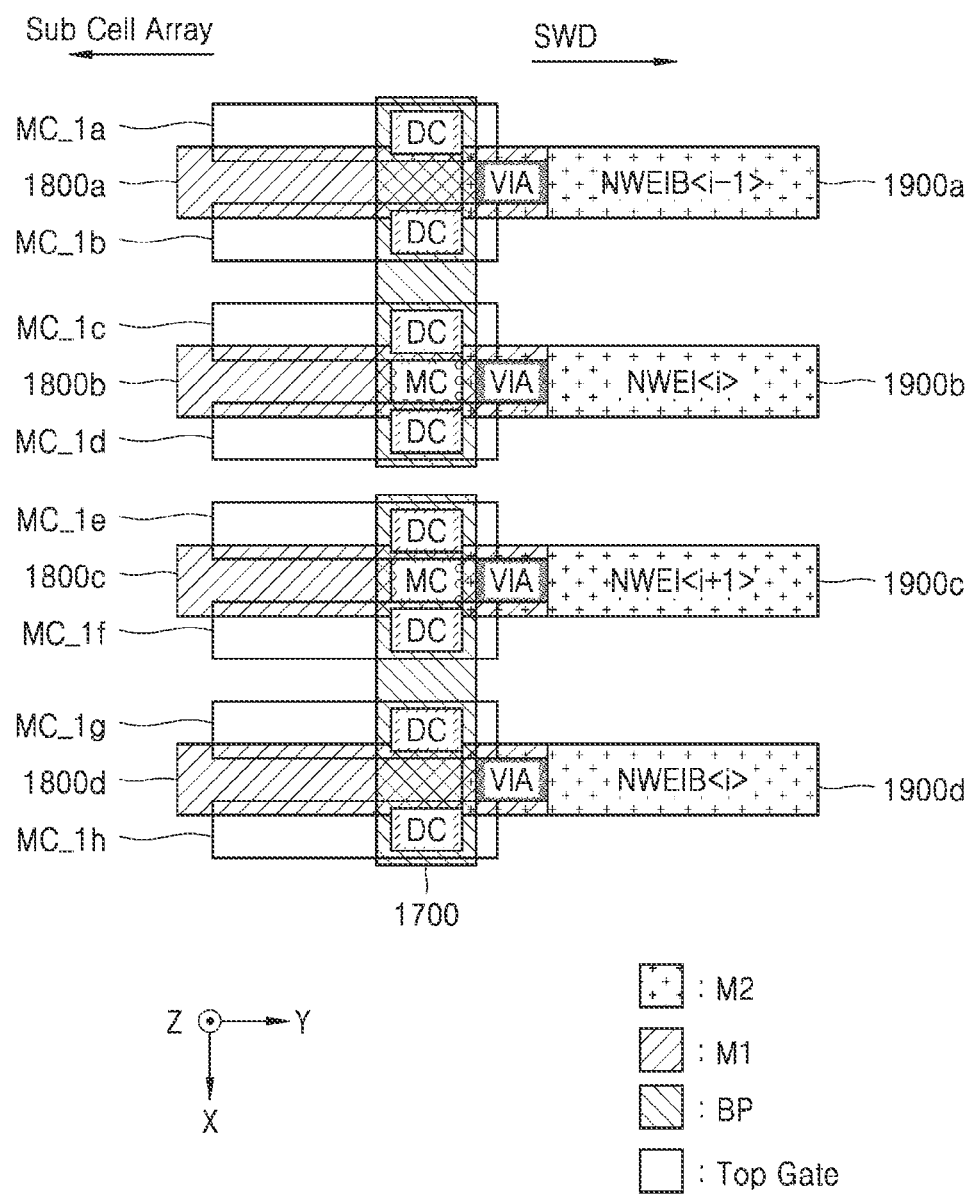
FIG. 8B is a plan view of an arrangement structure of a memory device, according to an embodiment.

FIG. 8B is a diagram of an arrangement structure of a metal line disposed between a sub cell array and the sub word line driver, according to an embodiment.

FIG. 8B is a top plan view of a connection configuration between the sub cell array and the sub word line driver. A configuration, in which upper gates MC_1a, . . . , MC_1h included in each of the eight memory cells MC are arranged apart from each other in an X-axis direction, is illustrated on the sub cell array side. A lower gate of the memory cell MC may be formed under each of the upper gates MC_1a, . . . , MC_1h.

Referring to FIG. 8B, an arrangement structure of the upper gates MC_1a, . . . , MC_1h of the memory cell MC, a buffer layer (BP) 1700 arranged on the memory cells MC, and M1 layers 1800a, 1800b, 1800c, and 1800d, and M2 layers 1900a, 1900b, 1900c, and 1900d, which are arranged on the buffer layer 1700, is disclosed. The M1 layers 1800a, 1800b, 1800c, and 1800d may be connected to the M2 layers 1900a, 1900b, 1900c, and 1900d through vias VIA, and the buffer layer 1700 may be connected to the upper gates MC_1a, . . . , MC_1h and the lower gates via contacts DC. The M1 layers 1800a, 1800b, 1800c, and 1800d may be connected to the upper gates MC_1a, . . . , MC_1h of the memory cells MC via the contacts MC. Referring still to FIG. 8B, the upper gates MC_1a, . . . , MC_1h may be disposed to extend in a Y-axis direction. According to an embodiment, the buffer layer 1700 extending in the X-axis direction vertical to an arrangement direction of the upper gates MC_1a, . . . , MC_1h may be disclosed. A word line signal may be applied to the buffer layer 1700. The word line signal may be applied from the buffer layer 1700 to a lower gate of each memory cell by using the contact DC.

According to an embodiment, the M2 layers 1900b and 1900c, to which the first and second word line enable signals NWEI<i> and NWEI<i+1> are applied, may be connected to the M1 layers 1800b and 1800c through the via VIA, and the M1 layers 1800b and 1800c may be connected to the upper gates MC_1c, MC_1d, MC_1e, and MC_1f via the contact DC, MC to apply the first and second word line enable signals NWEI<i> and NWEI<i+1>.

Figure 8C:
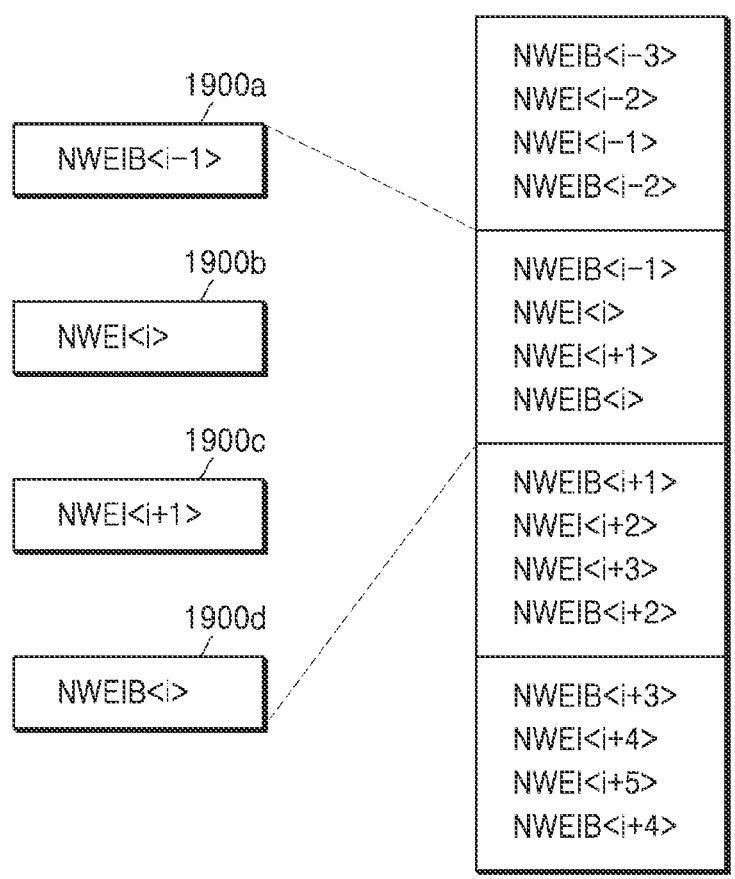
FIG. 8C is a diagram of a signal according to an arrangement structure of a memory device, according to an embodiment.
Figure 8D:
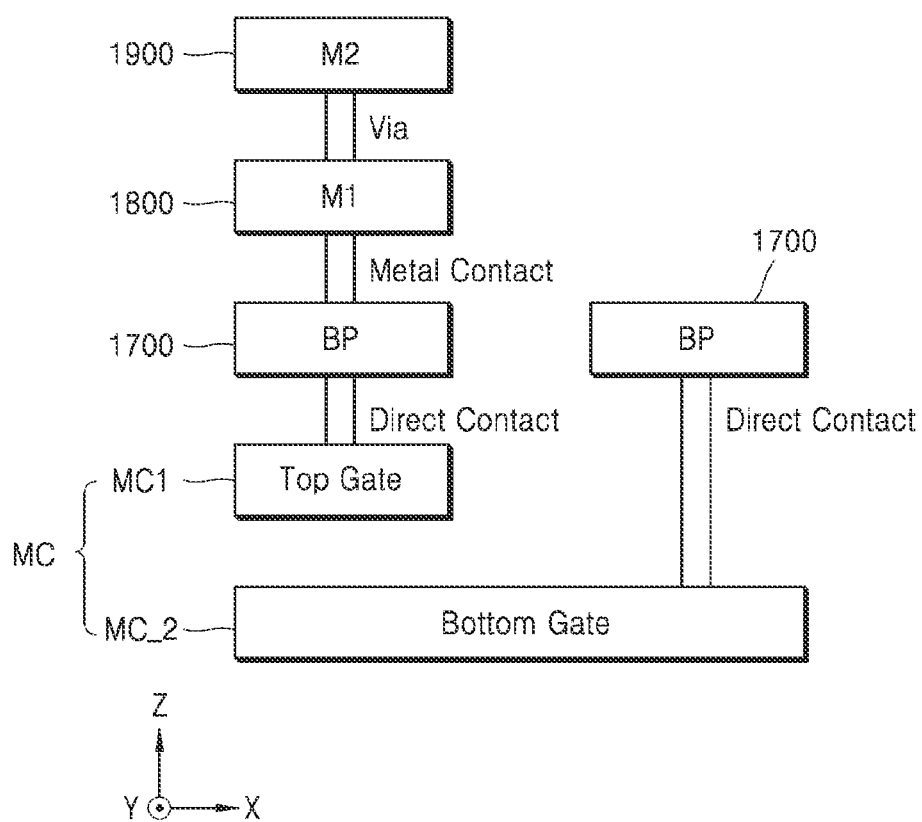
FIG. 8D is a cross-sectional view of a signal connection relationship applied to a memory device, according to an embodiment.

FIG. 8D is a cross-sectional view of a signal connection relationship applied to the memory cell MC, according to an embodiment.

Referring to FIG. 8D, the upper gate MC_1 and the lower gate MC_2 of the memory cell MC may be provided separately. The upper gate MC_1 and the lower gate MC_2 are illustrated as being apart from each other in a Z axis direction to show physical separation. The word line enable signal NWEI may be applied to the upper gate MC_1 of the memory cell MC, and the word line signal may be applied to the lower gate MC_2. The word line signal may be applied via the buffer layer (BP) 1700. The buffer layer 1700 may include a layer arranged on the upper gate MC_1. The buffer layer 1700 may be connected to the lower gate MC_2 via a first contact, that is, a direct contact. The word line enable signal NWEI may be connected via a metal line passing over the memory cell array. According to an embodiment, the word line enable signal NWEI may be applied by the M2 layer 1900. The word line enable signal NWEI may be applied to the upper gate MC_1 via the M2 layer 1900, the M1 layer 1800, and the buffer layer 1700. The M2 layer 1900 may be connected to the M1 layer 1800 through a via. The M1 layer 1800 may be connected to the buffer layer 1700 via a second contact, for example, a metal contact. The buffer layer 1700 may be connected to the upper gate MC_1 via the first contact. The first contact and the second contact may include a metal.

According to an embodiment, one word line enable signal NWEI may be utilized to cover a plurality of word lines. According to embodiments of FIGS. 7 and 8A, one first word line enable signal NWEI<i> may cover eight word lines. According to an embodiment of FIG. 9A to be described below, one first word line enable signal NWEI<i> may cover sixteen word lines.

Referring to FIG. 8D, the word line enable signal may be applied to the upper gate MC_1 of the plurality of memory cells MC via the buffer layer 1700. For example, to connect the word line enable signals NWEI to the upper gate of each of a plurality of corresponding memory cells MC, the word line enable signals NWEI may be distributed by using the buffer layer 1700 on an interface between the sub word line driver and the memory cell array.

Referring again to FIG. 8B, the M2 layers 1900a, 1900b, 1900c, and 1900d may include the first and second word line enable signals NWEI<i> and NWEI<i+1> or the first and second inverted word line enable signals NWEIB<i−1> and NWEIB<i>.

As described above with reference to FIG. 8A, to drive a memory cell, an application of an inverted word line enable signal may be utilized to be applied to a sub word line driver block, and a word line enable signal may be utilized to be applied to the memory cell. Accordingly, a metal line, to which a word line enable signal input to a memory cell connected to an output of one sub word line driver block is applied, and a metal line, to which an inverted word line enable signal input to the sub word line driver block is applied, may be arranged side by side.

According to an embodiment, a phase of the word line enable signal and a phase of the inverted word line enable signal may be opposite to each other. Because the phases of the word line enable signal and the inverted word line enable signal are opposite to each other, when the word line enable signal and the inverted word line enable signal are simultaneously applied from each of the adjacent metal lines, the probability of coupling occurrence may be increased.

For example, when a metal line, to which the first word line enable signal NWEI<i> is applied, and a metal line, to which the second inverted word line enable signal NWEIB<i> is applied, in which the activation timings are the same as $i^{th}$, are arranged adjacent to each other, signals having opposite phases from each other may be simultaneously applied and a coupling may occur, and thus, unfavorable effects may occur in a memory device.

Referring to FIG. 8B, a layout structure of metal lines, to which the first and second word line enable signals NWEI<i> and NWEI<i+1> or the first and second inverted word line enable signals NWEIB<i−1> and NWEIB<i> are applied, is disclosed. According to an embodiment, the metal lines, to which the first and second word line enable signals NWEI<i> and NWEI<i+1> or the first and second inverted word line enable signals NWEIB<i−1> and NWEIB<i> are applied, may include M2 layers.

A first inverted word line enable signal NWEIB<i−1> may be applied to a first metal line 1900a in FIG. 8B, and the first word line enable signal NWEI<i> may be applied to the second metal line 1900b. The second word line enable signal NWEI<i+1> may be applied to the third metal line 1900c, and the second inverted word line enable signal NWEIB<i> may be applied to the fourth metal line 1900d.

Referring to FIG. 8B, activation timings of signals applied to the first metal line 1900a and the second metal line 1900b may be different from each other, and activation timings of signals applied to the third metal line 1900c and the fourth metal line 1900d may be different from each other. Activation timings of the signals applied to the second metal line 1900b and the fourth metal line 1900d may be the same as each other. A signal applied to one of the first metal line

1900*a* and the second metal line 1900*b* may be a word line enable signal, and the signal applied to the other one may be an inverted word line enable signal. A signal applied to one of the third metal line 1900*c* and the fourth metal line 1900*d* may be a word line enable signal, and the signal applied to the other metal line may be an inverted word line enable signal.

The signals applied to the second metal line 1900*b* and the third metal line 1900*c*, which are adjacent to each other, may be signals of the same type. Referring to FIG. 8B, the signals applied to the second metal line 1900*b* and the third metal line 1900*c* may be word line enable signals.

In the case of an arrangement structure and a signal application method as illustrated in FIG. 8B, by varying activation timings of signals applied to the first metal line 1900*a* and the second metal line 1900*b*, which are adjacent to each other, the signals having opposite phases may be simultaneously activated, which may prevent coupling from occurring.

Referring to FIG. 8B, by varying activation timings of signals applied to the third metal line 1900*c* and the fourth metal line 1900*d*, which are adjacent to each other, signals having opposite phases may be simultaneously activated, which may prevent coupling from occurring.

By varying activation timings of signals applied to the second metal line 1900*b* and the third metal line 1900*c*, which are adjacent to each other, signals having opposite phases may be simultaneously activated, which may prevent coupling.

These arrangement are described in more detail below.

FIG. 8C is a diagram of a signal according to an arrangement structure of a memory device, according to an embodiment. FIG. 8C illustrates an example in which, when a plurality of memory devices having the structure as illustrated in FIG. 8B are provided, a word line enable signal and an inverted word line enable signal are applied to each metal line.

Referring to FIG. 8C, the metal line 1900*b*, to which the word line enable signal is applied, and the metal line 1900*a*, to which the inverted word line enable signal is applied, may be provided as a pair, and a pair of a first metal line, to which the word line enable signal is applied, and a second metal line, to which the inverted word line enable signal is applied, may be provided in a plurality.

Referring to FIG. 8C, the first word line enable signal NWEI<i> and the first inverted word line enable signal NWEIB<i−1> may be provided as a first pair, a second pair adjacent to the first pair may include the second word line enable signal NWEI<i+1> and the second inverted word line enable signal NWEIB<i>, and a third pair adjacent to the first pair may include a third inverted word line enable signal NWEIB<i−2> and a third word line enable signal NWEI<i−1>.

Signals respectively applied in one pair of a first metal line, to which the word line enable signal is applied, and a second metal line, to which an inverted word line enable signal is applied, may be applied as signals of the same type as that of the other pair of metal lines adjacent to the left and the right of the one pair. When a signal of the same type as the other pair of metal lines adjacent to the left and right of the one pair is applied, the activation timing of the applied signal may be different.

With reference to the first pair as an example, the second word line enable signal NWEI<i+1>, for example, the word line enable signal of the same type, may be applied to the metal line of the second pair adjacent to the metal line, to which the first word line enable signal NWEI<i> of the first pair is applied. The third inverted word line signal NWEIB<i−2>, for example, the inverted word line enable signal of the same type, may be applied to the metal line of the third pair adjacent to the metal line, to which the first inverted word line signal NWEIB<i−1> of the first pair is applied. When a signal of the same type is applied, the activation timing of each signal may be different.

According to an embodiment of the inventive concept, a first metal line, to which a word line enable signal is applied, and a second metal line, to which an inverted word line enable signal is applied, may be used in a pair, and a pair of a plurality of metal lines may be arranged side by side. According to an embodiment, adjacent metal lines of different pairs arranged side by side may be applied with a signal of the same type, and the activation timing of the applied signal may be different. In this manner, coupling between adjacent metal lines may be reduced.

Figure 9A:
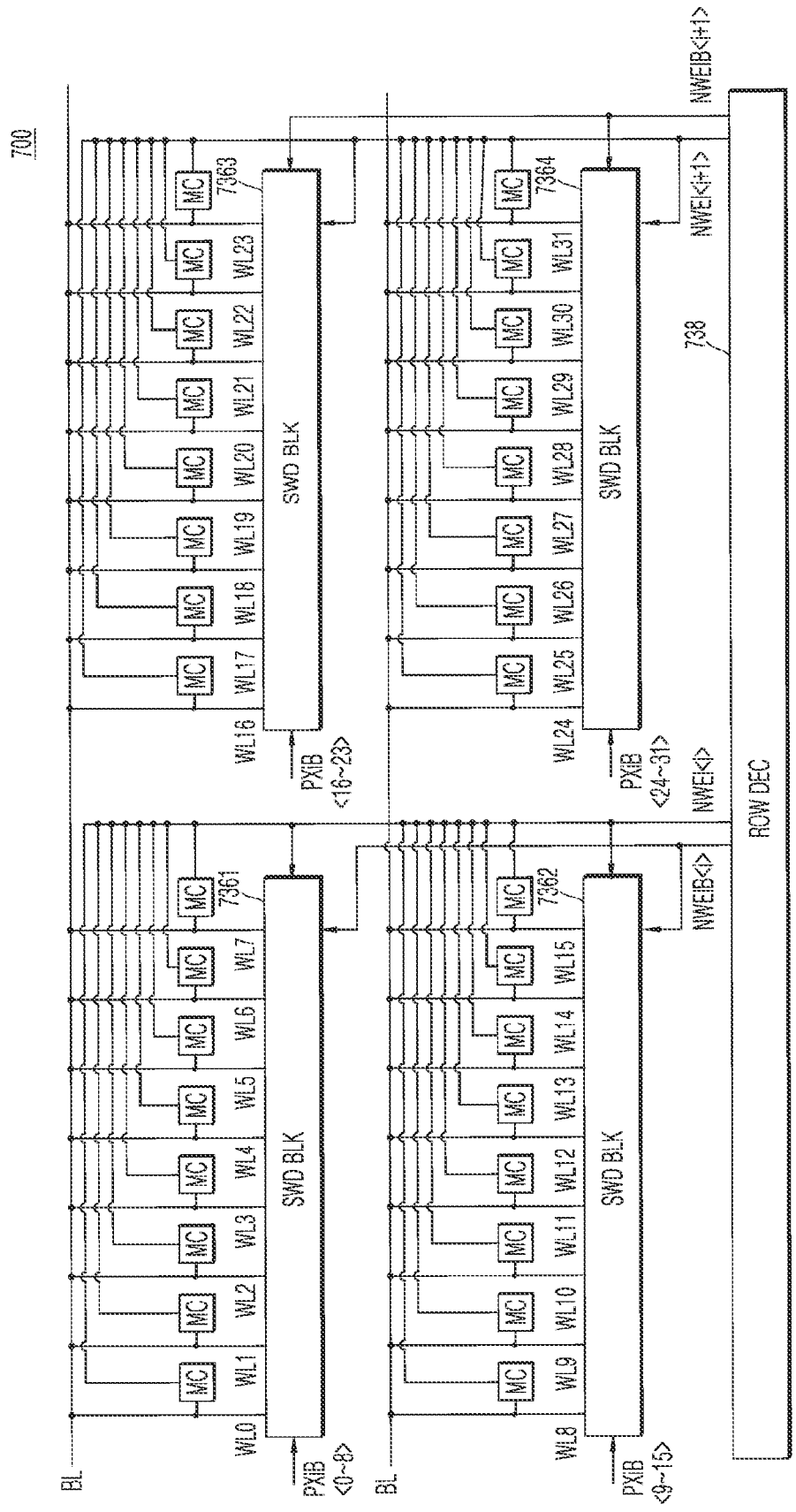
FIG. 9A is a block diagram of a memory device according to an embodiment.

FIG. 9A is a block diagram of a memory device according to an embodiment.

According to an embodiment, the block diagram of the memory device according to FIG. 9A may be a diagram to which a connection relationship between the sub word line driver and the memory cell MC according to embodiments of FIGS. 6A and 6B is applied. For convenience of explanation, a further description of components and technical aspects previously described with reference to FIG. 7 through 8B is omitted.

Referring to FIG. 9A, one row decoder 738 is disclosed, and four sub word line driver blocks 7361, 7362, 7363, and 7364 are disclosed. Each of the sub word line driver blocks may output eight word lines. For example, a first sub word line driver block 7361 may output first through eighth word line signals WL0 through WL7. A second sub word line driver block 7362 may output ninth through sixteenth word line signals WL8 through WL15. A third sub word line driver block 7363 may output seventeenth through twenty-fourth word line signals WL16 through WL23. A fourth sub word line driver block 7364 may output twenty-fifth through thirty-second word line signals WL24 through WL31.

In the memory device including the memory cells MC according to embodiments of FIGS. 6A and 6B, the number of sub word line driving signals connected in response to one word line enable signal NWEI may be greater than the number of those in embodiments of FIGS. 4A and 4B. According to an embodiment, in the memory device including the memory cells MC in FIGS. 4A through 4C, referring to FIG. 8A, the total number of driving signals connected in response to one word line enable signal NWEI<i> may be eight. According to an embodiment, in the memory device including the memory cells MC in FIGS. 6A and 6B, the number of driving signals connected in response to one word line enable signal NWEI may be sixteen.

When the number of driving signals connected to one word line enable signal NWEI increases, the number of driving signals connected to one sub word line driver increases by using the connection structure of the sub word line driver as illustrated in FIGS. 4A through 5, and thus, there may be a burden from an aspect of bussing.

Referring to FIGS. 6A, 6B, and 9A, to reduce a burden from the aspect of bussing, a driving signal applied to a sub word line driver and an inverted word line enable signal NWEIB may be swapped, and the inverted word line enable signal NWEIB, which has a small pitch compared to the driving signal, from the row decoder, may be connected to the second NMOS transistor 436_5 of the sub word line driver 436.

Referring to FIG. 9A, although the number of word lines to be controlled by one sub word line driver block is increased, only the inverted sub word line driving signal PXiB may be used as the driving signal, and because the total number of driving signals connected to the sub word line driver block is the same as that in FIG. 8A, one first word line enable signal NWEI<i> in FIG. 8A may secure a bussing space with respect to a circuit configuration, that outputs eight word lines.

Figure 9B:
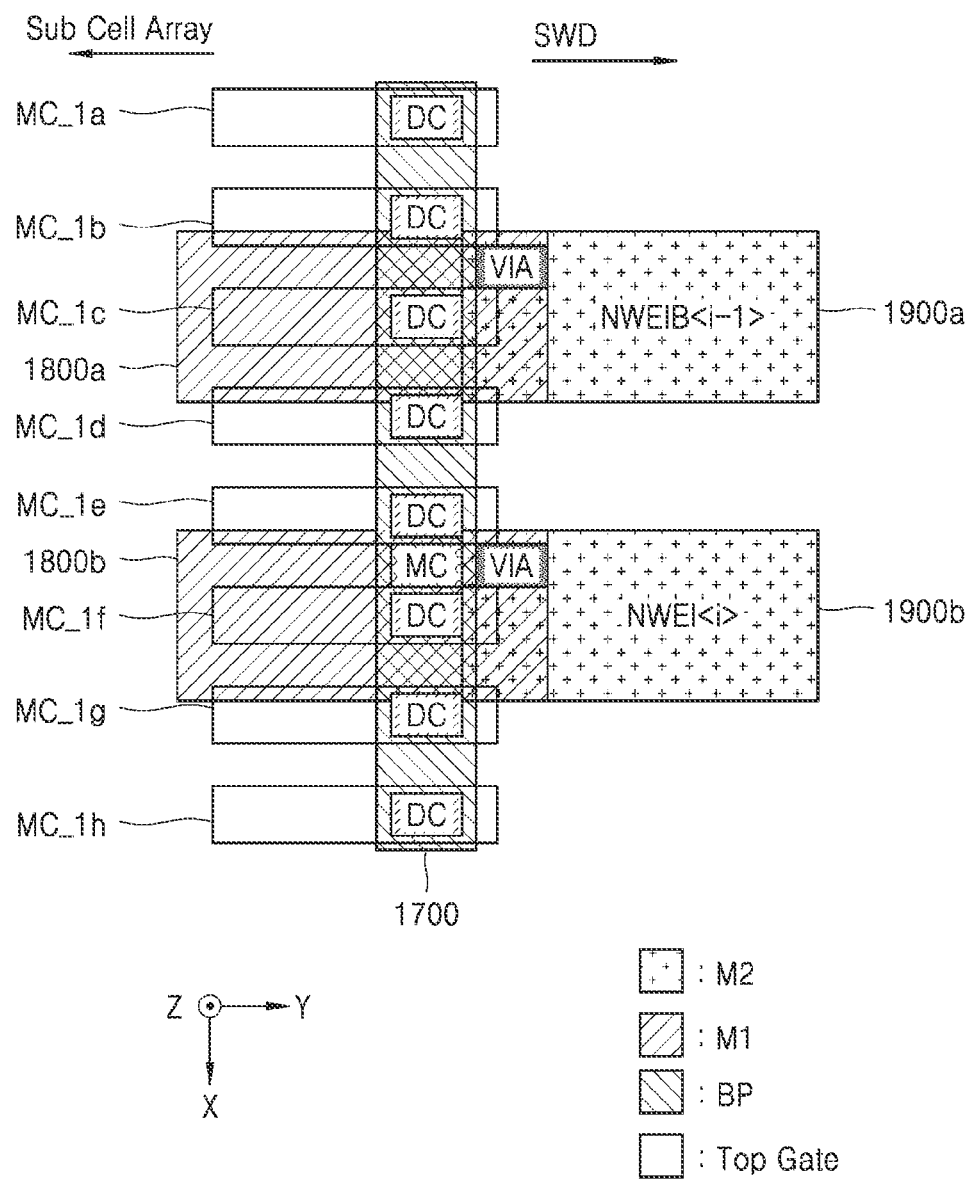
FIG. 9B is a plan view of an arrangement structure of a memory device, according to an embodiment.

FIG. 9B is a diagram of an arrangement structure of a metal line disposed between a sub cell array and the sub word line driver, according to an embodiment.

FIG. 9B is a top plan view of a connection configuration between the sub cell array and the sub word line driver in FIG. 9A. A configuration, in which the upper gates MC_1a, . . . , MC_1h included in each of the eight memory cells MC are arranged apart from each other in the X-axis direction, is illustrated on the sub cell array side. Referring to FIG. 9B, for convenience of explanation, a further description of components and technical aspects previously described with reference to FIGS. 8B through 8D is omitted.

Referring to FIG. 9B, an arrangement structure of the upper gates MC_1a, . . . , MC_1h of the memory cell MC, the buffer layer 1700 arranged on the memory cells MC, and M1 layers 1800a and 1800b, and M2 layers 1900a and 1900b, which are arranged on the buffer layer 1700, is disclosed. The M1 layers 1800a and 1800b may be connected to the M2 layers 1900a and 1900b via the VIA, and the buffer layer 1700 may be connected to the upper gates MC_1a, . . . , MC_1h and a lower gate via the contact DC. The M1 layers 1800a, 1800b, 1800c, and 1800d may be connected to the upper gates MC_1a, . . . , MC_1h of the memory cells via the contacts MC.

Referring again to FIG. 9B, the upper gates MC_1a, . . . , MC_1h may extend in the Y-axis direction. According to an embodiment, the buffer layer 1700 extending in the X-axis direction vertical to an arrangement direction of the upper gates MC_1a, . . . , MC_1h may be disclosed. A word line signal may be applied to the buffer layer 1700. The word line signal may be applied from the buffer layer 1700 to a lower gate of each memory cell MC by using the contact DC.

The first word line enable signal NWEI<i> or the first inverted word line enable signal NWEIB<i−1> may be applied to the M2 layers 1900a and 1900b. As described above with reference to FIG. 9A, to drive a memory cell, an application of the inverted word line enable signal and the word line enable signal may be utilized to be applied to the sub word line driver block, and the word line enable signal may be utilized to be applied to the memory cell. Accordingly, a metal line, to which a word line enable signal input to a memory cell connected to an output of one sub word line driver block is applied, and a metal line, to which an inverted word line enable signal input to the sub word line driver block is applied, may be arranged side by side.

Referring to FIG. 9B, a layout structure of metal lines, to which the first word line enable signal NWEI<i> or the first inverted word line enable signal NWEIB<i−1> is applied, is disclosed. According to an embodiment, the metal lines, to which the first word line enable signal NWEI<i> or the first inverted word line enable signal NWEIB<i−1> is applied, may include M2 layers.

A difference between FIG. 9B and FIG. 8B may be identified as that, in the case of the memory device according to FIG. 9B, the number of memory cells MC covered by the metal line 1900b, to which the word line enable signal is applied, and the metal line 1900a, to which the inverted word line enable signal is applied, is increased compared to FIG. 8B.

Figure 9C:
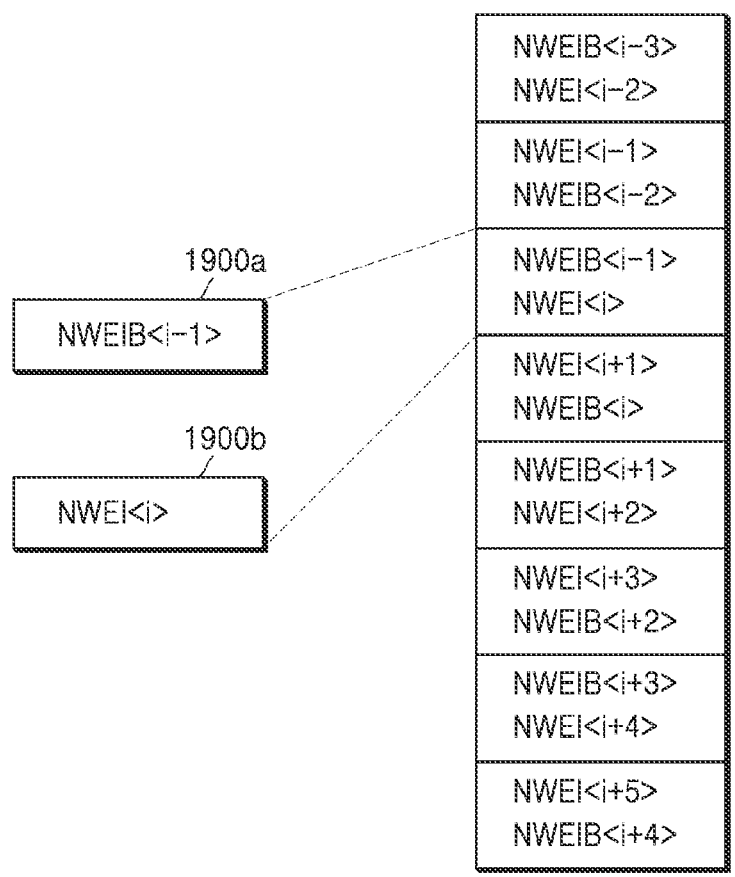
FIG. 9C is a diagram illustrating a signal according to an arrangement structure of a memory device, according to an embodiment.

FIG. 9C is a diagram illustrating a signal according to an arrangement structure of a memory device, according to an embodiment.

It is described that a word line enable signal and an inverted word line enable signal are applied to each metal line, when a plurality of memory devices having the structure as illustrated in FIG. 9C are provided.

Referring to FIG. 9C, a first metal line, to which the word line enable signal is applied, and a second metal line, to which the inverted word line enable signal is applied, may be provided as a pair, and a pair of a first metal line, to which the word line enable signal is applied, and a second metal line, to which the inverted word line enable signal is applied, may be provided in a plurality.

Referring to FIG. 9C, the first word line enable signal NWEI<i> and the first inverted word line enable signal NWEIB<i−1> may be provided as the first pair, the second pair adjacent to the first pair may include the second word line enable signal NWEI<i+1> and the second inverted word line enable signal NWEIB<i>, and the third pair adjacent to the first pair may include the third inverted word line enable signal NWEIB<i−2> and the third word line enable signal NWEI<i−1>.

According to embodiments of the inventive concept, signals respectively applied in one pair of a first metal line, to which the word line enable signal is applied, and a second metal line, to which an inverted word line enable signal is applied, may be applied as signals of the same type as that of the other pair of metal lines adjacent to the left and the right of the one pair. When a signal of the same type as the other pair of metal lines adjacent to the left and right of the one pair is applied, the activation timing of the applied signal may be different.

The gate area of the memory cell MC according to an embodiment of the inventive concept may be divided into the first gate and the second gate. The first gate may be the upper gate, and the second gate may be the lower gate. Voltages applied to each of the first gate and the second gate may be separately controlled. The word line enable signal NWEI, which is an address decoding information generated by the row decoder, may be applied to the first gate. A word line signal output from the sub word line driver may be applied to the second gate.

Because the word line enable signal NWEI is applied to one of the separated gates of the memory cell according to an embodiment of the inventive concept, the word line enable signal NWEI may have a voltage level different from that of an existing word line voltage. According to an embodiment, when a voltage higher than VBB2, for example, a voltage level in the existing word line standby mode, is applied to the upper gate in the standby mode, the GIDL current may be reduced, and when a voltage higher than VPP, for example, a voltage level in the existing word line active mode, is applied to the upper gate in the active mode, the tRDL may be improved.

As is traditional in the field of the inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

Referring to a comparative example, a word line voltage generator may generate a word line voltage in response to a standby signal. According to the word line voltage, a leakage current may be generated due to a gate induced drain leakage (GIDL) phenomenon in a transistor of a cell. When a leakage current occurs, a loss of cell data may be increased, and static refresh operation characteristics performed in a standby mode may remarkably degrade. To account for this, a reduction in the leakage current may be implemented.

To reduce a GIDL current, in the comparative example, a field of a drain portion of a transistor of a memory cell may be reduced. To this end, a voltage of a gate may be increased during the standby mode of DRAM, but increasing the voltage of the gate may degrade the dynamic refresh characteristics. Further, in the comparative example, increasing a voltage of a gate during the standby mode of DRAM may be implemented by using a work function difference between an upper portion and a lower portion of the gate electrode. However, selection of material may present a limitation.

Embodiments of the inventive concept account for these issues and provide a memory device capable of reducing a gate induced drain leakage (GIDL) current, as described above.

While embodiments of the inventive concept have been particularly shown and described with reference to embodiments thereof, it will be understood that various changes in form and detail may be made therein without departing from the spirit and scope of the inventive concept as defined by the following claims.

What is claimed is:

1. A memory device, comprising:
a memory cell array comprising a plurality of memory cells;
a sub word line driver block comprising a plurality of sub word line drivers configured to output word line signals, which are respectively provided to the plurality of memory cells; and
a row decoder configured to generate word line enable signals, which are respectively provided to the plurality of memory cells,
wherein each of the memory cells comprises a cell transistor comprising dual gates, and a capacitor connected to the cell transistor,
a word line enable signal among the world line enable signals provided by the row decoder is connected to one of the dual gates,
the dual gates comprise a first gate and a second gate,
the first gate and the second gate are physically separated from each other,
the word line enable signal is provided to the first gate, and
a word line signal among the word line signals is provided to the second gate.

2. The memory device of claim 1, wherein the row decoder is configured to control a voltage level of the word line enable signal provided to the first gate.

3. The memory device of claim 2, wherein the row decoder generates the word line enable signal such that the voltage level of the word line enable signal provided to the first gate is about equal to or greater than a voltage level of the word line signal provided to the second gate.

4. The memory device of claim 2, wherein when the memory device is in a standby mode, the row decoder controls the voltage level of the word line enable signal to be different from a standby voltage based on the second gate.

5. The memory device of claim 2, wherein when the memory device is in an active mode, the row decoder controls the voltage level of the word line enable signal to be different from an active voltage based on the second gate.

6. A memory device, comprising:
a memory cell array comprising a plurality of memory cells;
a plurality of sub word line drivers configured to output word line signals, which are respectively provided to the plurality of memory cells; and
a row decoder configured to generate word line enable signals, which are respectively provided to the plurality of memory cells,
wherein each of the sub word line drivers comprises:
a p-type metal-oxide semiconductor (PMOS) transistor;
a first n-type metal-oxide semiconductor (NMOS) transistor; and
a second NMOS transistor,
wherein a word line enable signal among the word line enable signals is provided to a drain of the PMOS transistor,
an inverted sub word line driving signal is provided to a gate of the PMOS transistor,
an inverted word line enable signal, which is obtained by inverting the word line enable signal, is provided to a gate of the second NMOS transistor, and
a word line signal among the word line signals is output to a common connection contact point of a source of the PMOS transistor, a drain of the first NMOS transistor, and a drain of the second NMOS transistor.

7. The memory device of claim 6, wherein each of the memory cells comprises a cell transistor comprising dual gates, and a capacitor connected to the cell transistor, and
the word line enable signal provided by the row decoder is provided to one of the dual gates.

8. The memory device of claim 7, wherein the dual gates comprise an upper gate and a lower gate,
the upper gate and the lower gate are physically separated from each other,
the word line enable signal is provided to the upper gate, and
the word line signal is provided to the lower gate.

9. The memory device of claim 8, wherein the row decoder is configured to control a voltage level of the word line enable signal provided to the upper gate.

10. The memory device of claim 9, wherein the row decoder generates the word line enable signal such that the voltage level of the word line enable signal provided to the upper gate is about equal to or greater than a voltage level of the word line signal provided to the lower gate.

11. The memory device of claim 9, wherein when the memory device is in a standby mode, the row decoder controls the voltage level of the word line enable signal to be different from a standby voltage based on the lower gate.

12. The memory device of claim 6, wherein a number of the word line signals output by the sub word line drivers is eight.

13. A memory device, comprising:
a plurality of memory cells, each comprising an upper gate and a lower gate;
a first metal line connected to upper gates of some among the plurality of memory cells; and
a second metal line arranged adjacent to the first metal line,
wherein an activation timing of the first metal line is different from an activation timing of the second metal line.

14. The memory device of claim 13, further comprising:
a third metal line arranged adjacent to a second side surface opposite to a first side surface of the first metal line,
wherein the second metal line is arranged adjacent to the first side surface of the first metal line, and
the activation timing of the first metal line is different from an activation timing of the third metal line.

15. The memory device of claim 14, wherein a first word line enable signal is applied to the first metal line,
a first inverted word line enable signal is applied to the second metal line, and
a second word line enable signal is applied to the third metal line.

16. The memory device of claim 14, further comprising:
a fourth metal line arranged adjacent to the second side surface of the third metal line,
wherein the first metal line and the second metal line form a first pair, and
the third metal line and the fourth metal line form a second pair.

17. The memory device of claim 16, wherein a first signal applied to a metal line comprised in the first pair, and a second signal applied to a metal line comprised in the second pair arranged adjacent to the metal line comprised in the first pair, are of a same type.

18. The memory device of claim 17, wherein a signal of the same type is a word line enable signal or an inverted word line enable signal.

19. The memory device of claim 17, wherein an activation timing of the first signal is different from an activation timing of the second signal.

* * * * *